(12) United States Patent
Lee et al.

(10) Patent No.: US 7,416,908 B2
(45) Date of Patent: Aug. 26, 2008

(54) METHOD FOR FABRICATING A MICRO STRUCTURE

(75) Inventors: Chii Guang Lee, Fremont, CA (US); Shaoher X. Pan, San Jose, CA (US); Hung Kwei Hu, Saratoga, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 115 days.

(21) Appl. No.: 11/382,630

(22) Filed: May 10, 2006

(65) Prior Publication Data

US 2007/0134896 A1    Jun. 14, 2007

Related U.S. Application Data

(60) Provisional application No. 60/750,506, filed on Dec. 14, 2005.

(51) Int. Cl.
*H01L 21/00* (2006.01)
(52) U.S. Cl. .............................. 438/30; 438/60; 438/75; 257/E21.17; 257/E21.189; 257/E21.278; 257/E21.613; 257/E29.228

(58) Field of Classification Search ................... 438/30, 438/25, 26, 51, 55, 60, 64, 65, 75, 197, 199, 438/680, 684, 685, 551, 671, 722, 723, 754, 438/756, 733, 743
See application file for complete search history.

(56) References Cited

U.S. PATENT DOCUMENTS

| | | | | |
|---|---|---|---|---|
| 6,356,378 | B1 * | 3/2002 | Huibers | 359/291 |
| 6,396,619 | B1 * | 5/2002 | Huibers et al. | 359/291 |
| 6,529,310 | B1 * | 3/2003 | Huibers et al. | 359/291 |
| 6,538,800 | B2 * | 3/2003 | Huibers | 359/291 |
| 6,827,866 | B1 * | 12/2004 | Novotny | 216/2 |
| 6,992,810 | B2 | 1/2006 | Pan et al. | 359/290 |
| 2002/0071166 | A1 * | 6/2002 | Jin et al. | 359/224 |
| 2002/0071169 | A1 * | 6/2002 | Bowers et al. | 359/291 |
| 2005/0128564 | A1 | 6/2005 | Pan | |

* cited by examiner

*Primary Examiner*—David Nhu
(74) *Attorney, Agent, or Firm*—Fish & Richardson P.C.

(57) ABSTRACT

A method for fabricating a micro structure includes depositing a first layer of a first material over a substrate; patterning a first hard mask over the first layer; depositing a second layer of a second material over the first layer and the first hard mask; patterning a second hard mask over the second layer; and selectively removing the first material and the second material not covered by any of the first mask and the second mask to produce over the substrate the micro structure having a first structure portion having a first height and a second structure portion having a second height.

24 Claims, 23 Drawing Sheets

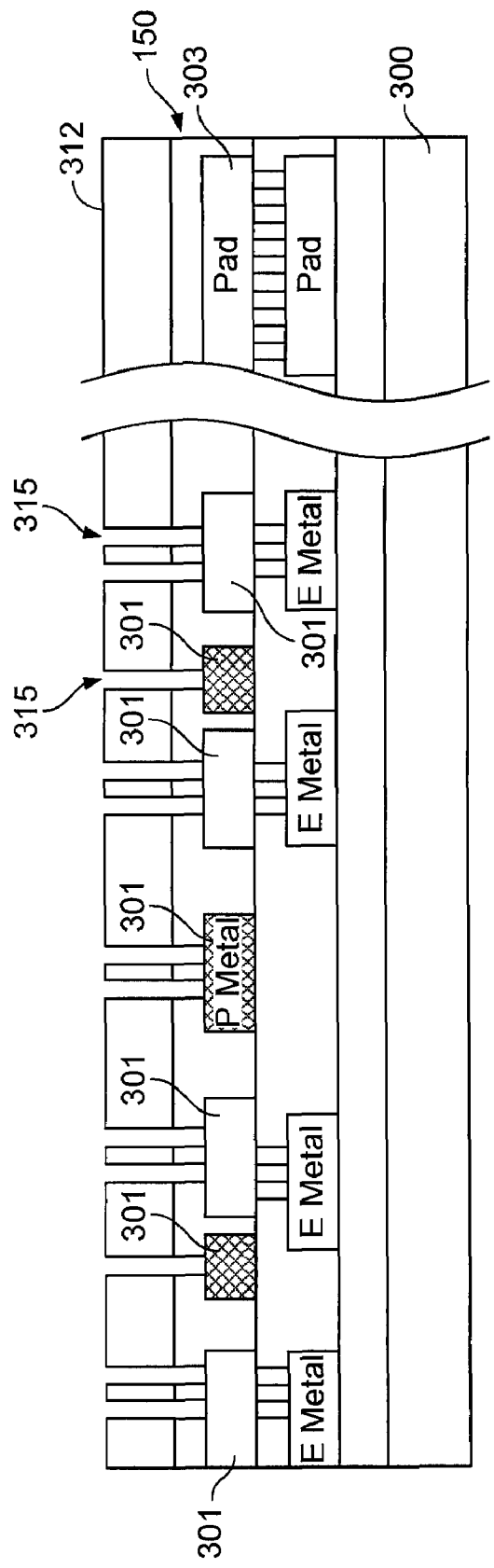
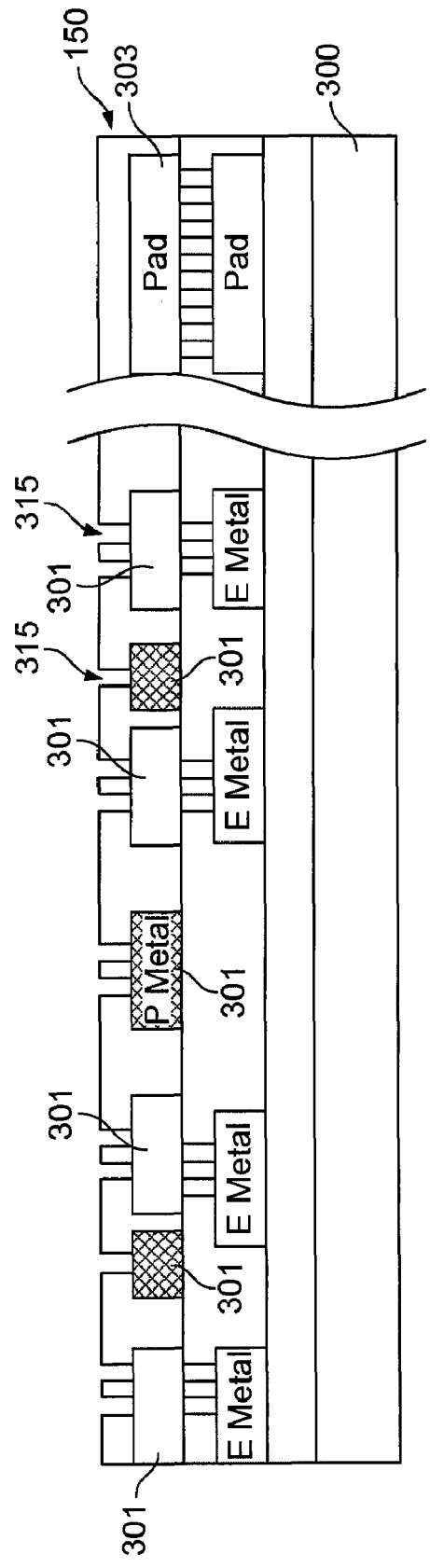
FIG. 3C
FIG. 3D

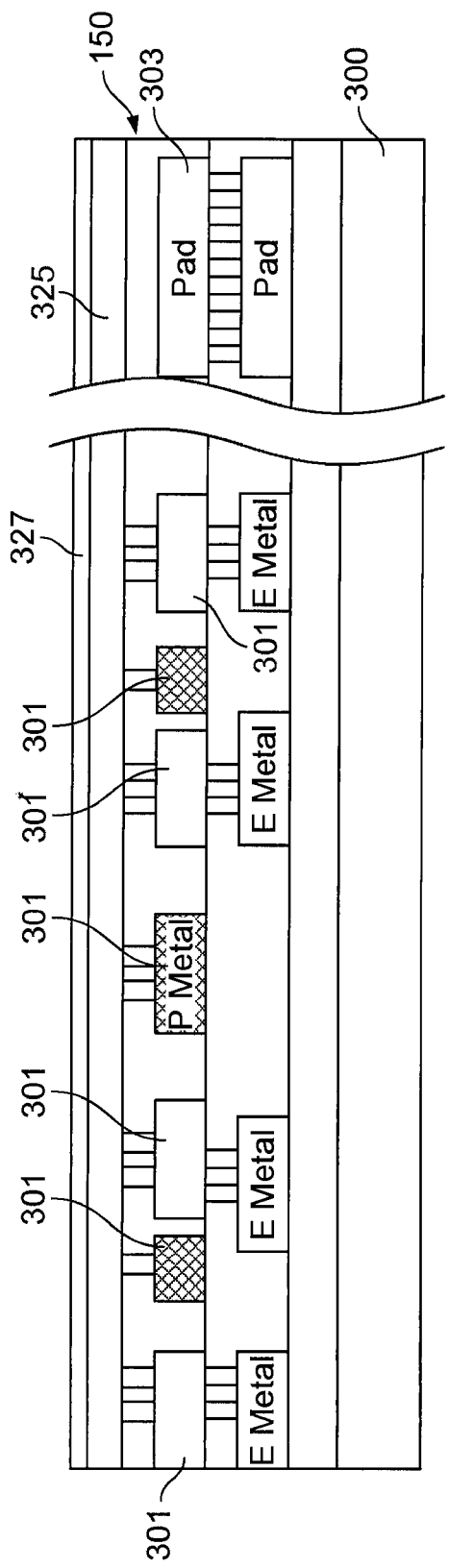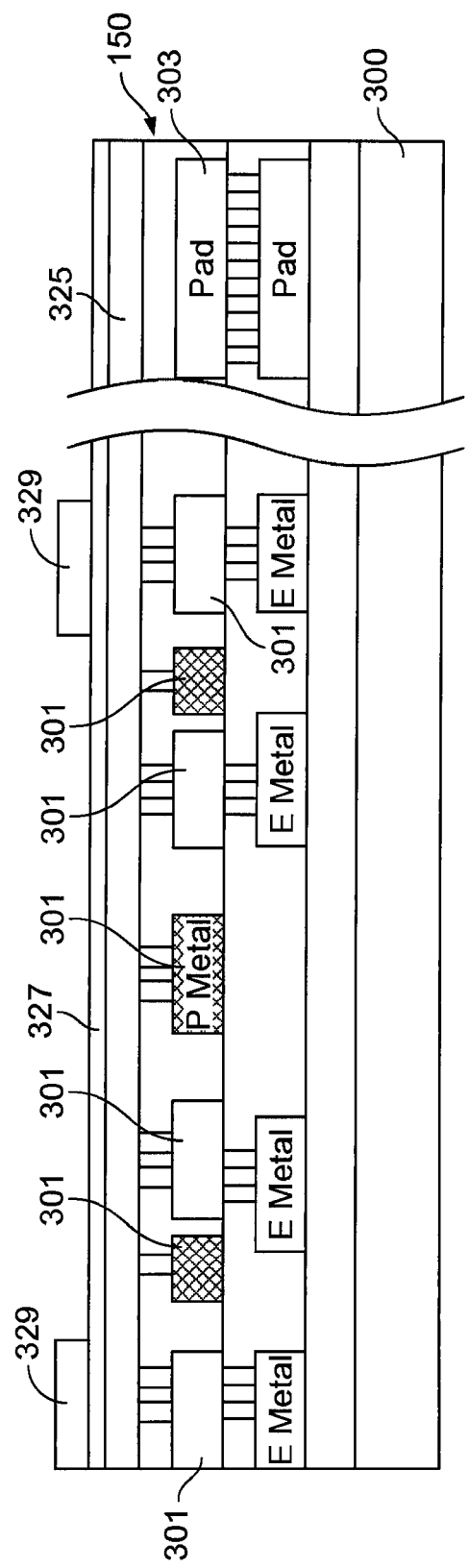

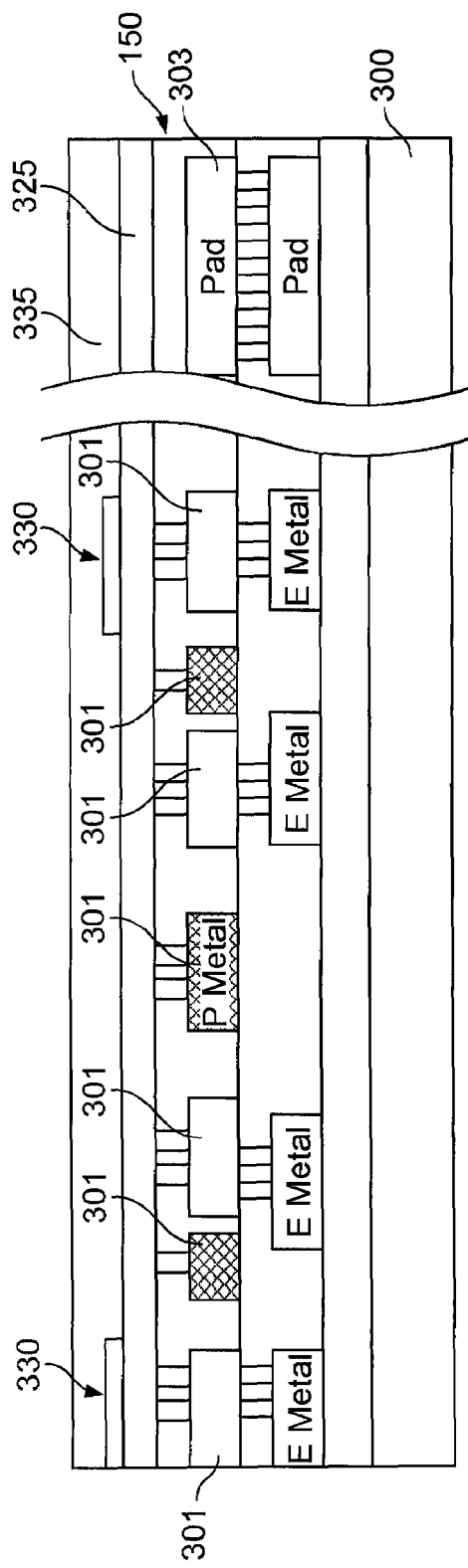
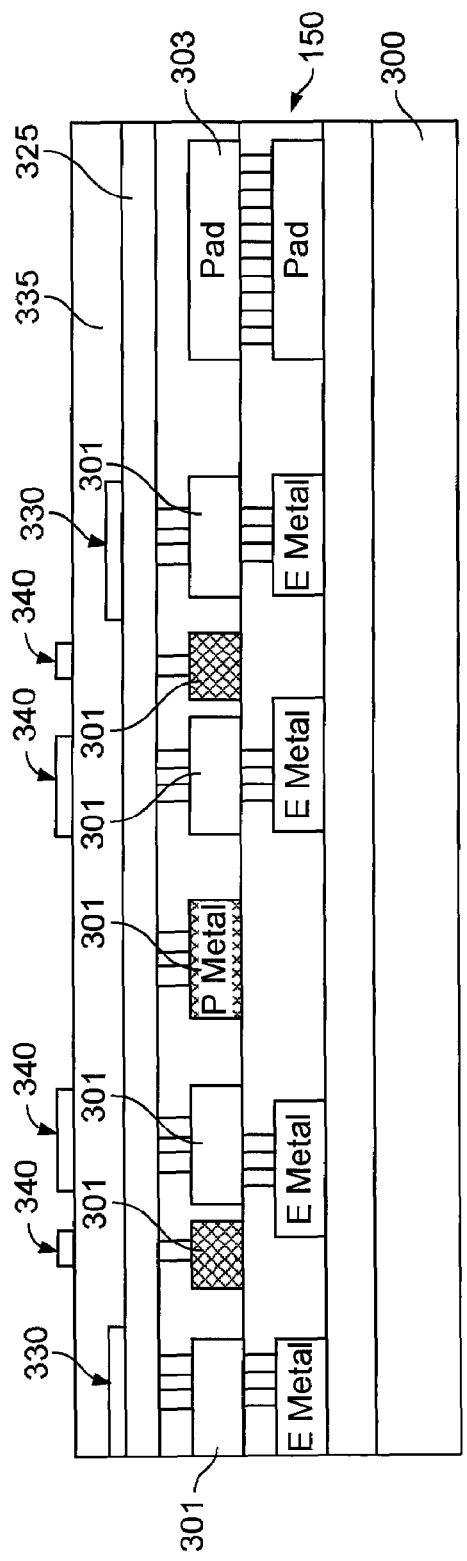
FIG. 3M
FIG. 3N

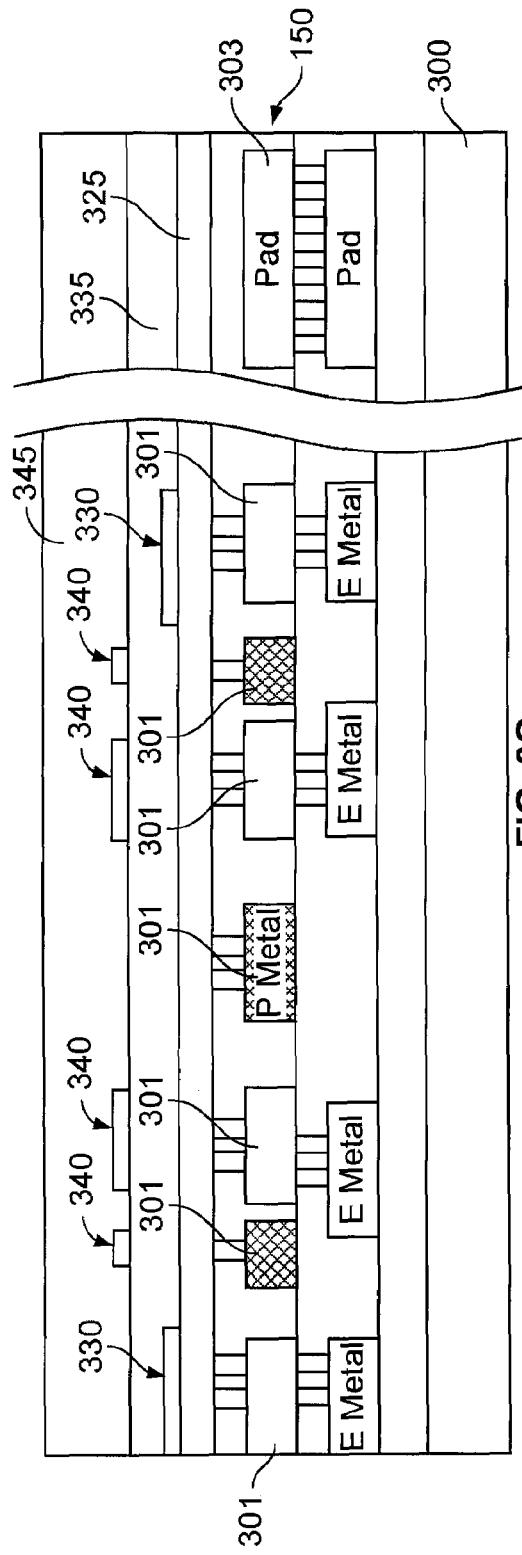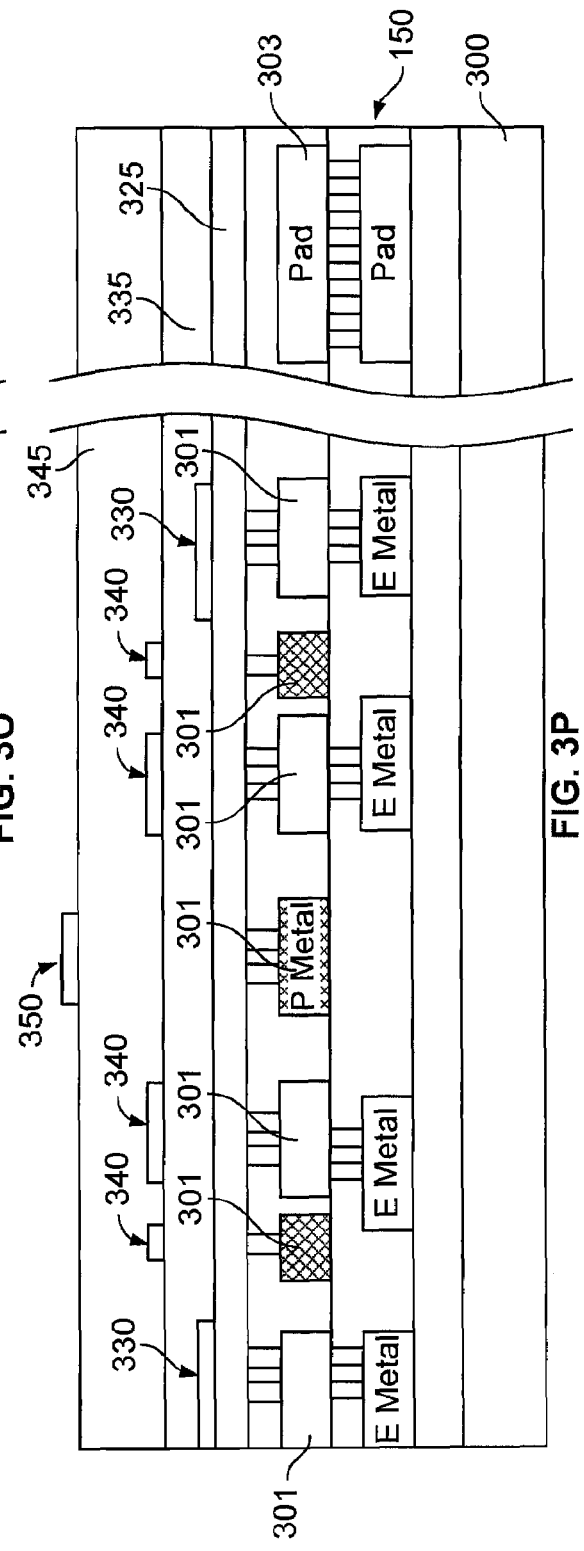

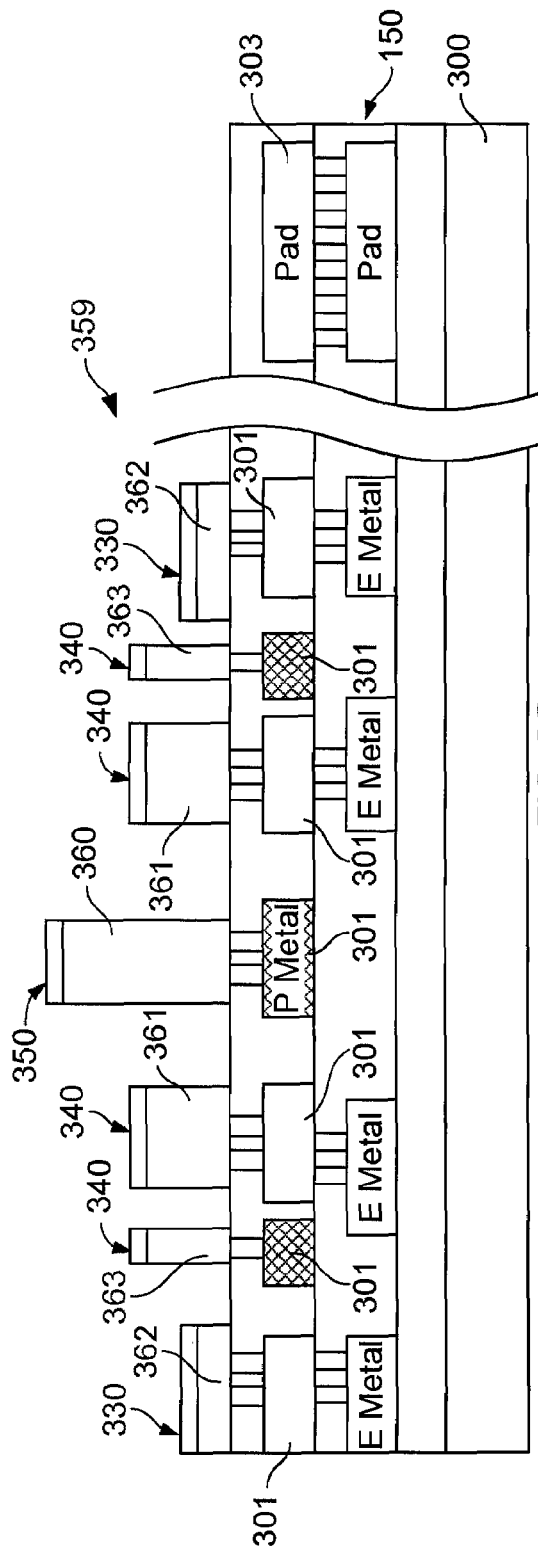
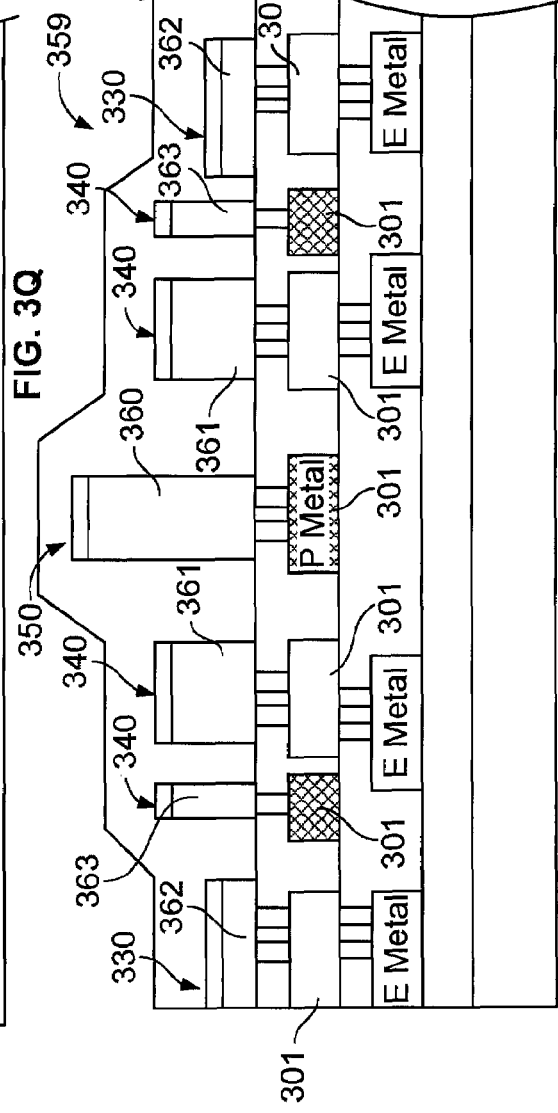
FIG. 3Q
FIG. 3R

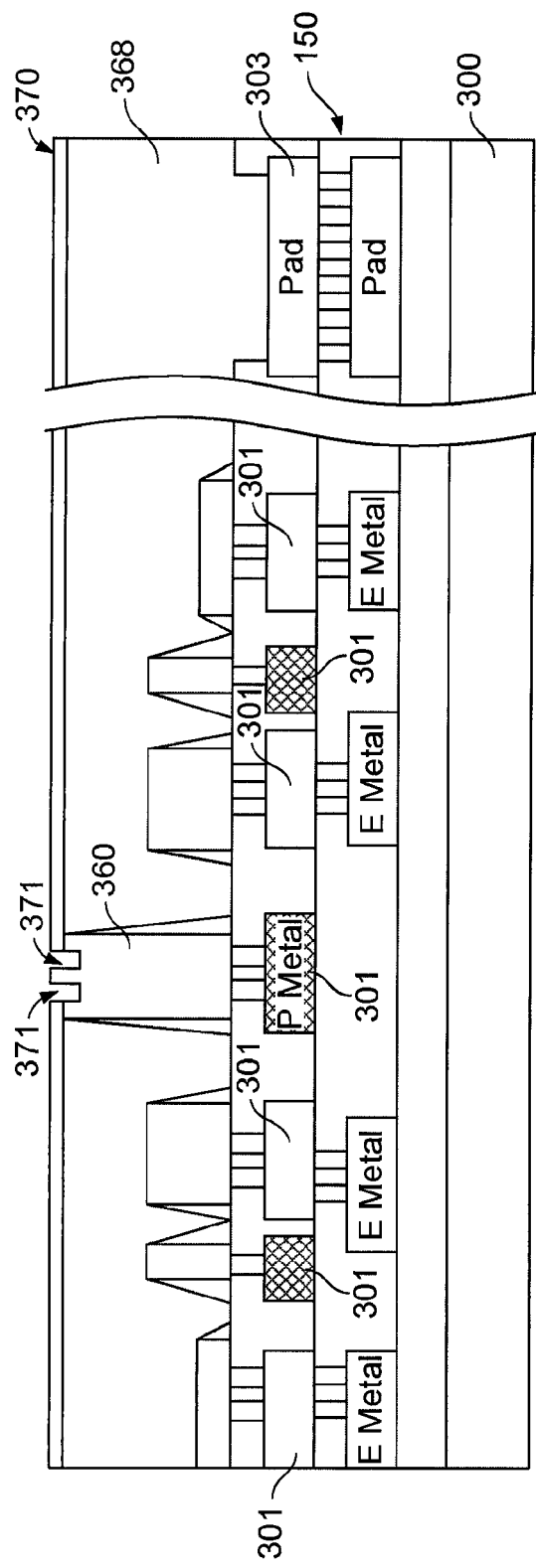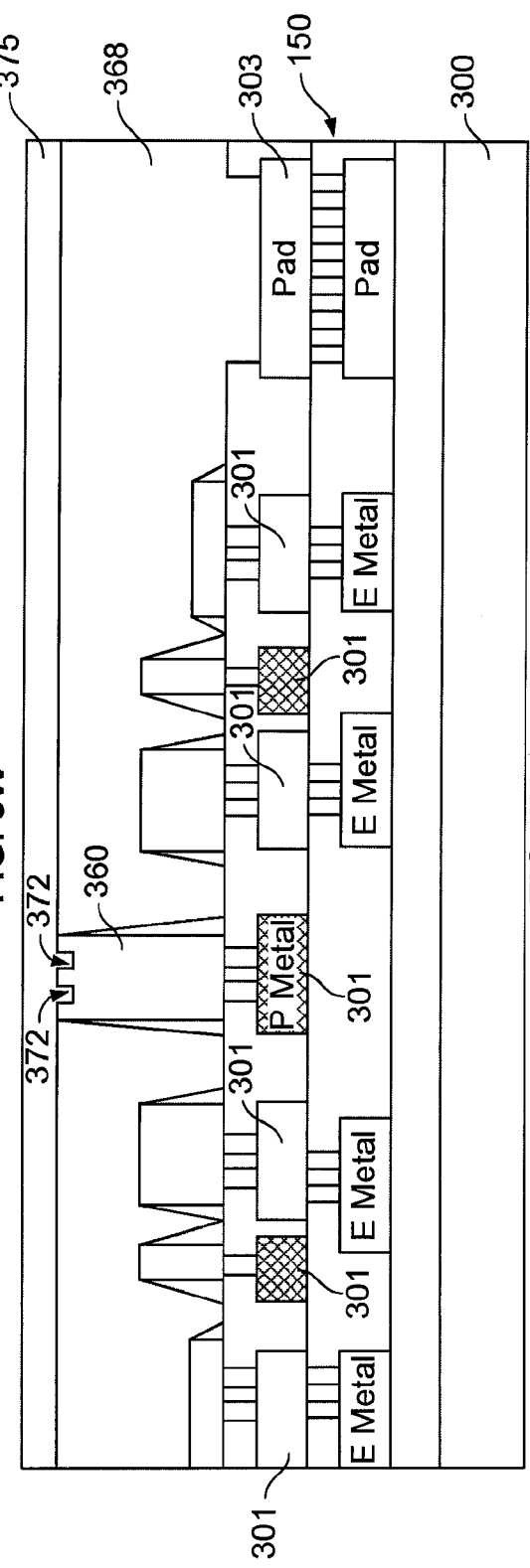

METHOD FOR FABRICATING A MICRO STRUCTURE

CROSS-REFERENCE TO RELATED APPLICATIONS

This application claims the benefit of U.S. Provisional Application No. 60/750,506, filed on Dec. 14, 2005, which is incorporated by reference herein.

BACKGROUND

The present disclosure relates to the fabrication of micro structures such as spatial light modulators.

A micro-mirror array is a type of spatial light modulator (SLM) that includes an array of micro mirrors. Each micro mirror can be tilted about an axis by electrostatic forces. The electrostatic forces can be generated by electric potential differences between the mirror plate and an electrode over the substrate underneath the mirror plate. In a digital mode of operation, the micro mirror plate can be tilted to two positions: an "on" position and an "off" position. In the "on" position, the micro mirror plate directs incident light to an assigned pixel of a display device. In the "off" position, the micro mirror plate directs incident light away from the display device. The micro mirror can be stopped by mechanical stops and held to stay at the "on" and the "off" positions. The SLM can selectively tilt micro mirrors in the micro-mirror array to project light to display image pixels in a display image. A display device is usually required to refresh image frames at high frequencies typical of video applications. Each image frame refreshing can involve the tilting of the micro mirrors once or multiple times. Reliable and fast mirror tilt movement is therefore an essential requirement for mirror-based SLM devices. One issue related to the mirror response rate is the stiction between the mirror plate and the mechanical stops. The stiction can cause a delay in the mirror tilt response or prevent a mirror from tilting to a new orientation.

SUMMARY

In one general aspect, the present invention relates to a method for fabricating a micro structure. The method includes depositing a first layer of a first material over a substrate; patterning a first hard mask over the first layer; depositing a second layer of a second material over the first layer and the first hard mask; patterning a second hard mask over the second layer; and selectively removing the first material and the second material not covered by any of the first mask and the second mask to produce over the substrate the micro structure having a first structure portion having a first height and a second structure portion having a second height.

In another general aspect, the present invention relates to a method for fabricating a micro structure. The method includes depositing a first layer of a first material over a substrate; patterning a first hard mask over the first layer; depositing a second layer of a second material over the first layer and the first hard mask; patterning a second hard mask over the second layer;

depositing a third layer of a third material over the second layer and the second hard mask; patterning a third hard mask over the third layer; and selectively removing the first material, the second material, and the third material not covered by any of the first mask, the second mask, and the third mask to produce over the substrate the micro structure having a first structure portion having a first height, a second structure portion having a second height, and a third stricture portion having a third height.

In another general aspect, the present invention relates to a method for fabricating a micro structure. The method includes producing a multi-layer structure comprising a plurality of layers over a substrate, wherein the multi-layer structure includes hard masks respectively patterned over at least two of the plurality of layers; and selectively removing the materials in the multi-layer structure not covered by any of the hard masks over any of the plurality of layers to produce the micro structure having at least two structure portions having different heights relative to the substrate.

In another general aspect, the present invention relates to a method for fabricating a micro mirror over a substrate. The method includes depositing a first layer of a first material over the substrate; patterning a first hard mask over the first layer; depositing a second layer of a second material over the first layer and the first hard mask; patterning a second hard mask over the second layer; selectively removing the first material and the second material not covered by any of the first mask and the second mask to produce a hinge support post having a first height and an electrode having a second height over the substrate; and forming a mirror plate comprising a reflective upper surface and a hinge component in connection with the hinge support post, wherein the mirror plate is configured to tilt around the hinge component.

In another general aspect, the present invention relates to a method for fabricating a micro mirror over a substrate. The method includes depositing a first layer of a first material over the substrate; patterning a first hard mask over the first layer; depositing a second layer of a second material over the first layer and the first hard mask; patterning a second hard mask over the second layer; selectively removing the first material and the second material not covered by any of the first mask and the second mask to produce a hinge support post having a first height, an electrode having a second height, and a landing tip having a second height over the substrate; and forming a mirror plate comprising a reflective upper surface and a hinge component in connection with the hinge support post, wherein the mirror plate is configured to tilt around the hinge component.

In another general aspect, the present invention relates to a method for fabricating a micro mirror over a substrate. The method includes depositing a first layer of a first material over the substrate; patterning a first hard mask over the first layer; depositing a second layer of a second material over the first layer and the first hard mask; patterning a second hard mask over the second layer; depositing a third layer of a third material over the second layer and the second hard mask; patterning a third hard mask over the third layer; selectively removing the first material, the second material, and the third material not covered by any of the first mask, the second mask, and the third mask to produce over the substrate a hinge support post having a first height, a first electrode having a second height, and a landing tip having a second height, and a second electrode having a third height; and forming a mirror plate comprising a reflective upper surface and a hinge component in connection with the hinge support post, wherein the mirror plate is configured to tilt around the hinge component.

Implementations of the system may include one or more of the following. The first material or the second material can be selected from the group of amorphous silicon, polysilicon, silicon, aluminum, and aluminum-silicon alloys. The first material can include substantially the same composition as the second material. The first structure portion of the first height and the second structure portion of the second height can be laterally separated over the substrate. The first structure portion or the second structure portion can include a substantially flat upper surface and substantially vertical side surfaces. The first material or the second material can include an electrically conductive material. The substrate can include an electrode under the first hard mask or the second hard mask to allow electric connection between the electrode and the electrically conductive material. The first hard mask or the second hard mask can include silicon dioxide or TiN. The first hard mask can be embedded between the first layer and the second layer. The method can further include controlling the first height of the first structure portion by controlling the thickness of the first layer. The method can further include controlling the second height of the second structure portion by controlling the thickness of the first layer and the thickness of the second layer. The method can further include anisotropically etching to selectively remove the second material in the second layer not covered by the second mask and the first material in the first layer not covered by the first mask or the second mask. The method can further include selectively removing the second material in the second layer not covered by the second mask and the first material in the first layer not covered by the first mask or the second mask in a single etching step. The patterning of the first hard mask over the first layer can include depositing a layer of an oxide material over the first layer; patterning a photoresist material over the layer of oxide material; removing the oxide material not covered by the photoresist; and removing the photoresist material to form the first hard mask over the first layer. The patterning of the second hard mask over the second layer can include depositing a layer of oxide material over the second layer; patterning a photoresist material over the layer of an oxide material; removing the oxide material not covered by the photoresist; and removing the photoresist material to form the second hard mask over the second layer. The method can further include planarizing the first layer before patterning the first hard mask over the second layer. The method can further include planarizing the second layer of the second material before patterning the second hard mask over the second layer.

Implementations may include one or more of the following advantages. The disclosed system and methods provide an improved process for fabricating a micro structure including two or more structure portions having different heights over a substrate. The heights of the structure portions are defined by the thicknesses of the layers deposited over the substrate. The lateral dimensions of the structure portions are determined by the sizes of the hard masks patterned over each layer. The hard mask for the lower layer can be embedded under one or more layers of deposited materials. The micro structure can be formed by one or more etching steps that can remove the materials in several layers not covered by any of the hard masks. The disclosed process reduces manufacturing complexity and costs. The disclosed methods are applicable to micromechanical electric systems (MEMS) for display and printing, micro actuators, micro controllers, micro fluidic systems, and micro sensors.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and from a part of the specification, illustrate embodiments of the present invention and, together with the description, serve to explain the principles of the invention.

FIG. 3C is a cross-sectional view of the CMOS substrate after the via etching using the photoresist mask shown in FIG. 3B.

FIG. 3D is a cross-sectional view of the CMOS substrate after the removal of the photoresist after the via etching shown in FIG. 3C.

FIG. 3I is a cross-sectional view of the substrate after a layer of silicon dioxide deposited over the first electrode layer shown in FIG. 3H.

FIG. 3J is a cross-sectional view of the substrate after the patterning of a photoresist mask over the silicon dioxide layer shown in FIG. 3I.

FIG. 3M illustrates the deposition of a second electrode layer over the first electrode layer and the embedding of the first hard mask between the first and the second electrode layers.

FIG. 3N illustrates the formation of a second hard mask over the second electrode layer.

FIG. 3O illustrates the deposition of a third electrode layer over the second electrode layer and the embedding of the second hard mask between the second and the third electrode layers.

FIG. 3P illustrates the formation of a third hard mask over the third electrode layer.

FIG. 3Q is the formation of the microstructure after a multi-layer etching removal of the materials in the first, the second, and the third electrode layers not covered by any of the hard masks.

FIG. 3R illustrates the deposition of spacer materials over the micro structure of FIG. 3Q.

FIG. 3W is a cross-sectional view of the substrate after the etching of holes over the top surface of the hinge support post.

FIG. 3X is a cross-sectional view of the substrate after the deposition of a Ti layer over the TiN layer shown in FIG. 3W.

DETAILED DESCRIPTION

Figure 1A:
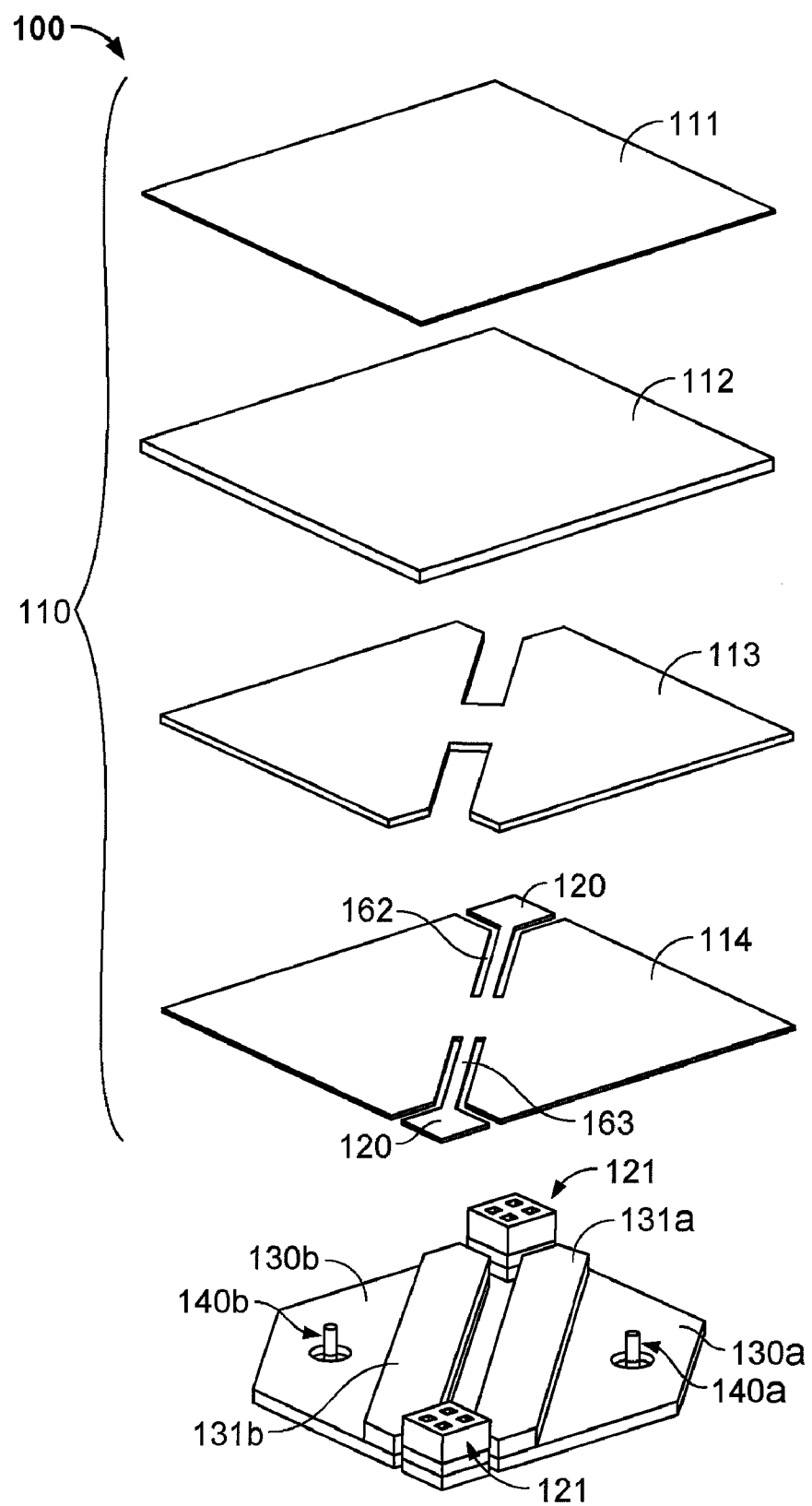
FIG. 1A illustrates an expanded view of a micro mirror in a micro-mirror based spatial light modulator.
Figure 1B:
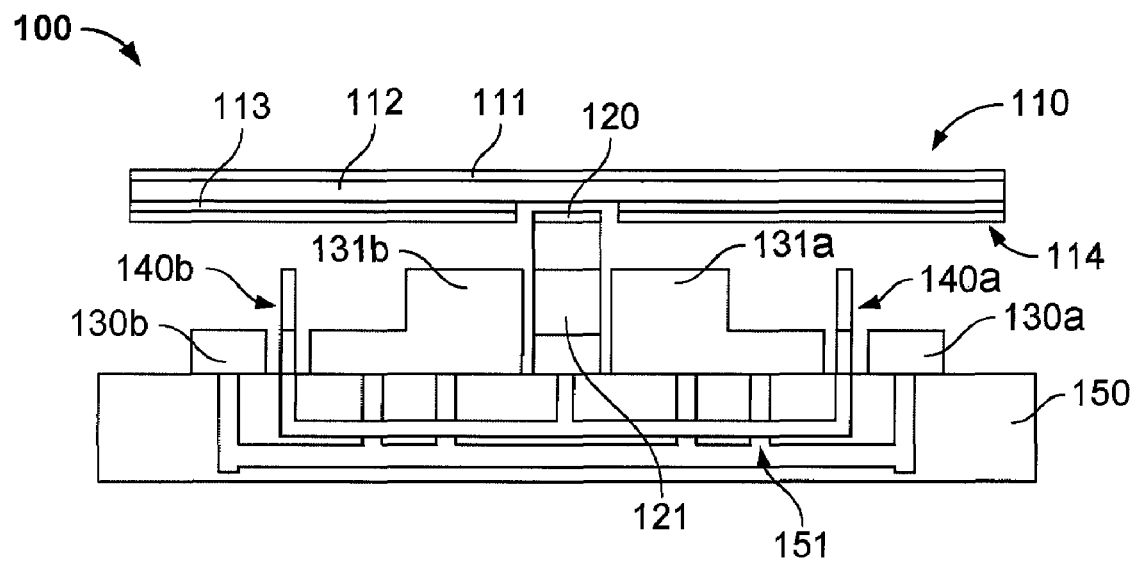
FIG. 1B illustrates a cross-sectional view of the micro mirror in the micro-mirror based spatial light modulator of FIG. 1A.
Figure 1C:
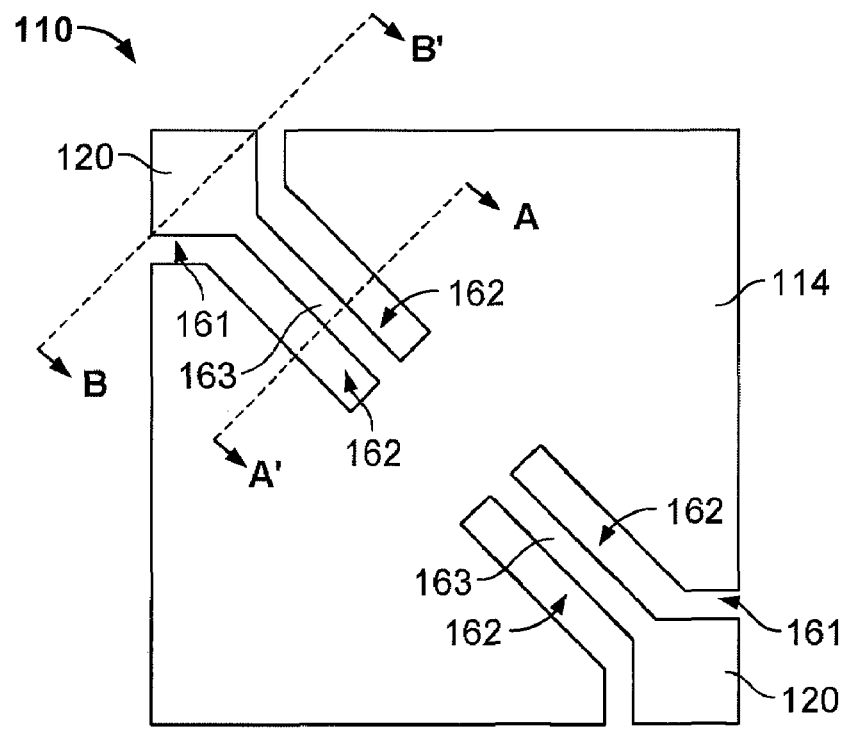
FIG. 1C is a bottom view of the mirror plate in the micro-mirror based spatial light modulator of FIG. 1A.

FIG. 1A and FIG. 1B respectively illustrate an expanded view and a cross-sectional view of a micro mirror in a micro-mirror based spatial light modulator 100. The spatial light modulator 100 can include an array of cells, each including a micro mirror as shown in FIGS. 1A and 1B. FIG. 1C shows a bottom view of the mirror plate 110. The lines A-A' and B-B' indicate the locations of the cross sections for the cross-sectional view shown in FIG. 1B. To illustrate the micro structures around the hinge 120 and the landing tips 140a and 140b, the cross-sectional views of the various fabrication stages of the spatial light modulator 100 (e.g., FIG. 1B, FIGS. 3A-3X, and FIGS. 4A-4F) in the present application include superimposed views at cross-sections along the lines A-A' and B-B'.

A mirror plate 110 includes a reflective layer 111, a support layer 112, a spacer layer 113, and a hinge layer 114. One or more hinge components 120 are each connected to and supported by a hinge support post 121 that is joined with the CMOS substrate 150. The hinge components 120 are in connection with the mirror plate 110 through an elongated connection portion 163 in the hinge support layer 114. The hinge support layer 114 is electrically conductive and is electrically connected with the hinge components 120 and their respective hinge support posts 121. The side surfaces of each of the elongated connection portions 163 are separated from the rest of the hinge support layer 114 by channels 162. Each hinge component 120 extends into a cavity 161 at a corner of the mirror plate 110 and, thus, is completely hidden from the top view. The air gap in the cavity 161 can be approximately 0.13 microns or larger. The mirror plate 110 can be tilted about an axis defined by the two pivot points at the two hinge components 120.

The spatial light modulator 100 formed on the CMOS substrate 150 also includes step electrodes 130a and 130b, and landing tips 140a and 140b. An electric potential bias between the mirror plate and the step electrodes 130a and 130b can produce an electrostatic torque necessary for inducing the mirror tilt movement. The landing tips 140a and 140b can stop the tilt movement of the mirror plate 110 and hold the mirror plate 110 at a precise orientation.

The step electrodes 130a and 130b and the landing tips 140a and 140b can include top surfaces of different heights from each other. The step electrodes 130a and 130b includes several stepped upper surfaces that are designed to reduce the air gaps between the step electrodes 130a, 130b and the mirror plate 110 and increase the strengths of electrostatic torques. For ease of manufacturing as described below, the higher upper surfaces 131a, 131b of the step electrodes 130a and 130b can have the same height as the landing tips 140a and 140b such that they can be formed from the same deposition layers formed by the same processing steps.

In another embodiment, the landing tips 140a and 140b can be positioned closer to the corners of the mirror plate 110. The electrodes 130a, 130b are eliminated while the lower step of the step electrodes 130a, 130b are widened comparing the dimensions shown in FIGS. 1A and 1B. For ease of manufacturing, the heights of the landing tips 140a and 140b can be the same as the lower steps of the step electrodes 130a, 130b so that the lower steps of the step electrodes 130a, 130b and the landing tips 140a, 140b can be fabricated from the same layer. This configuration allows the landing tips 140a, 140b to stop the tilt movement of the mirror plate 110 before the mirror plate 110 touches the step electrodes 130a, 130b while keeping an air gap between the mirror plate 110 and the step electrodes 130a, 130b.

The CMOS substrate 150 includes conductive addressing and driving circuit 151 that can selectively address and transmit control voltage signals to each micro mirror 110 in the spatial light modulator 100. The addressing and driving circuit 151 is electrically connected to the hinge support post 121, the step electrodes 130a and 130b, and the landing tips 140a and 140b that are formed by conductive materials. The hinge support post 121, the hinge support layer 114, and the landing tips 140a and 140b can be electrically connected at the same electric potential. The electric potentials of the step electrodes 130a and 130b can be separately controlled. The potential difference between the hinge support layer 114 and the step electrode 130a and between the hinge support layer 114 and the step electrodes 130b can produce electrostatic forces to result in tilt movements of the mirror plate 110.

Figure 2:
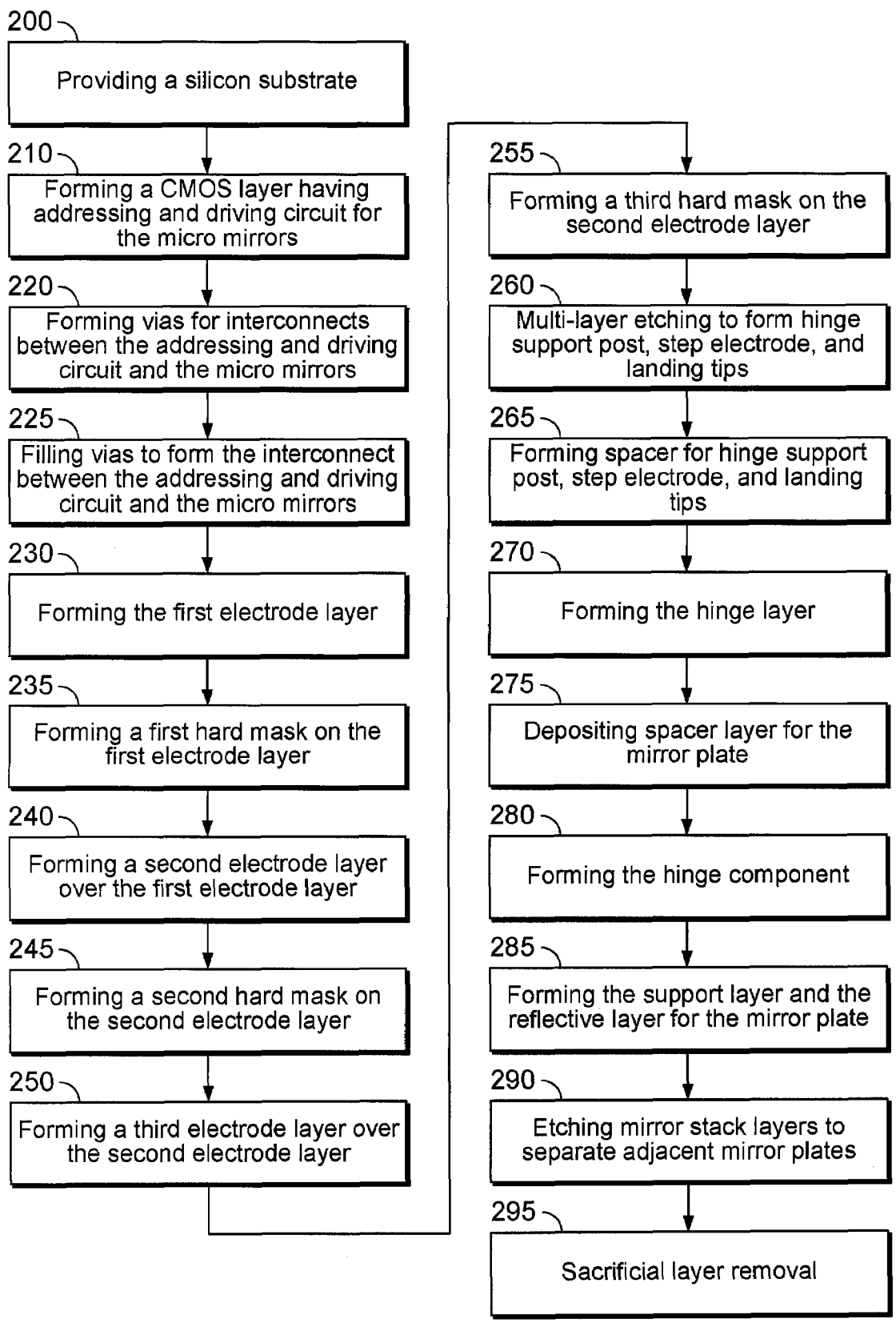
FIG. 2 illustrates a process flow diagram for manufacturing the micro-mirror based spatial light modulator of FIG. 1A.
Figure 3A:
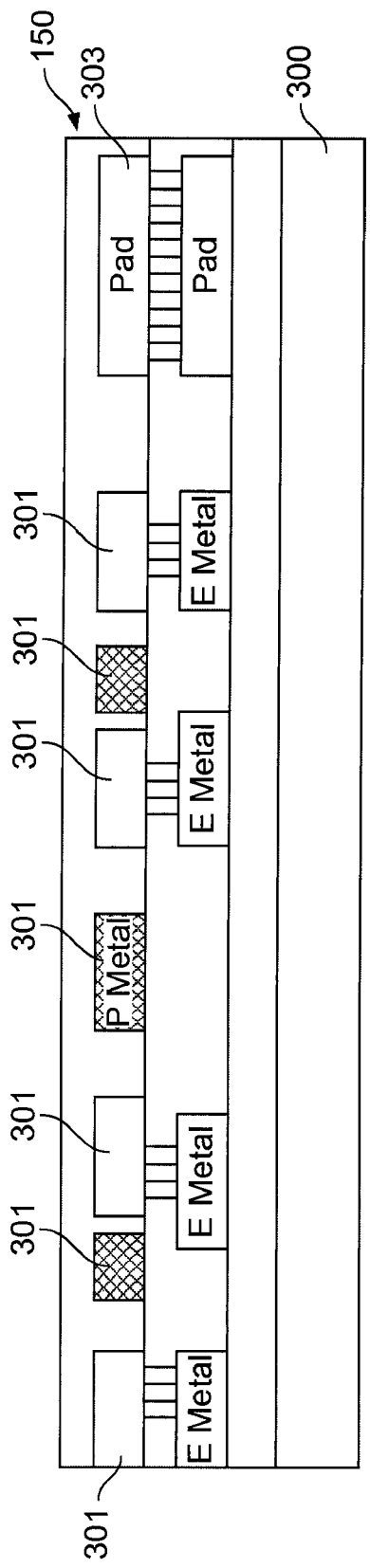
FIG. 3A is a cross-sectional view of a CMOS substrate including addressing and driving circuit for transmitting electronic signals to the micro mirrors.

FIG. 2 illustrates a manufacturing process flow diagram for the micro-mirror based spatial light modulator of FIG. 1A. The manufacturing process begins with providing a silicon substrate 300 (step 200) and the forming a CMOS layer 150 (step 210) as shown in FIG. 3A. The CMOS layer includes addressing and driving circuit and a plurality of metallic pads 301 to be connected to the appropriate hinge support post 121, the step electrodes 130a and 130b, and the landing tips 140a and 140b corresponding to the respective micro mirrors in a plurality of cells. A pad electrode 303 allows the addressing and driving circuit 151 in the CMOS substrate 150 to receive external electric signals for addressing and controlling the movement of the micro mirrors in the spatial light modulator 100. In an array of micro mirrors 110, the electric voltages of the step electrodes 130a, 130b can be controlled by a plurality of parallel bit lines. The electric voltages of the hinge support post 121 and the landing tips 140a and 140b can be controlled by a plurality of word lines.

Figure 3B:
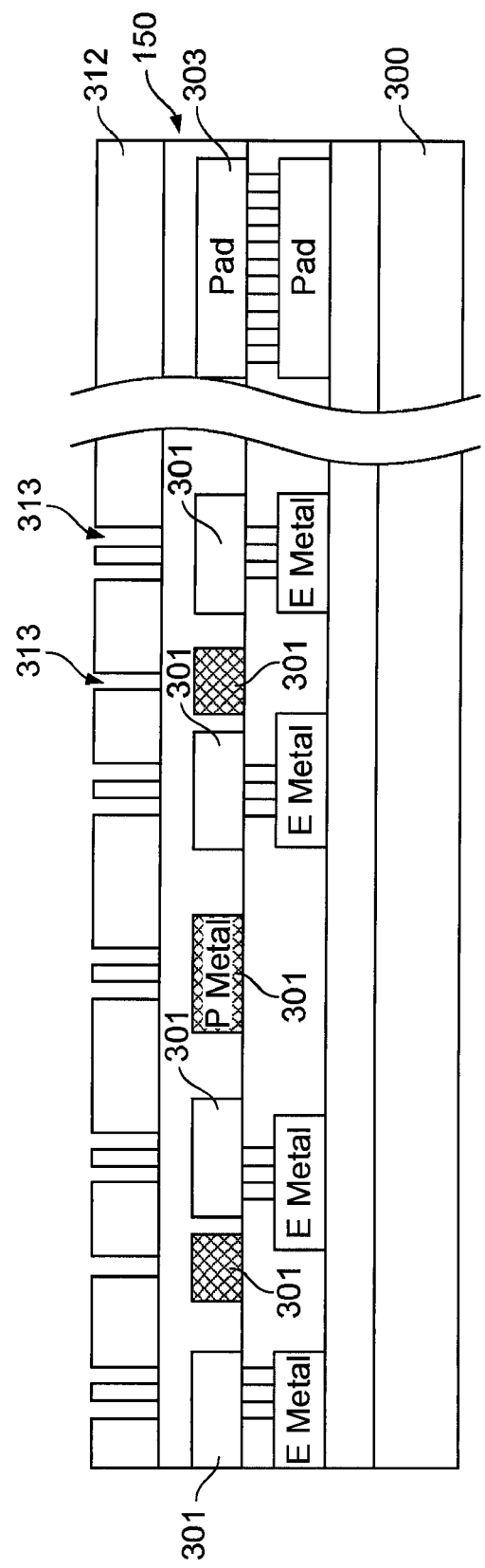
FIG. 3B is a cross-sectional view of the CMOS substrate patterned with a photoresist mask for forming vias for the electric interconnect between the micro mirrors and the addressing and driving circuit in the CMOS substrate.

Via holes are next made for the electric interconnects between the micro mirrors 100 and the metallic pads 301 in the CMOS layer 150 (step 220). A photoresist mask layer 312 is first patterned over the CMOS layer 150 using lithography equipment as shown in FIG. 3B. The photoresist mask layer 312 includes a plurality of holes 313 that expose the upper surface of the CMOS layer 150 at locations directly above the metallic pads 301. Each metal interconnect can include two vias to increase electric conductivity and the redundancy against manufacturing errors. A plurality of vias 315 are formed by dielectric etching through the holes 313 in the photoresist mask layer 312, as shown in FIG. 3C. The remaining photoresist in the photoresist mask layer 312 is stripped using microwave cleaning. The structure after the microwave cleaning is shown in FIG. 3D.

Figure 3E:
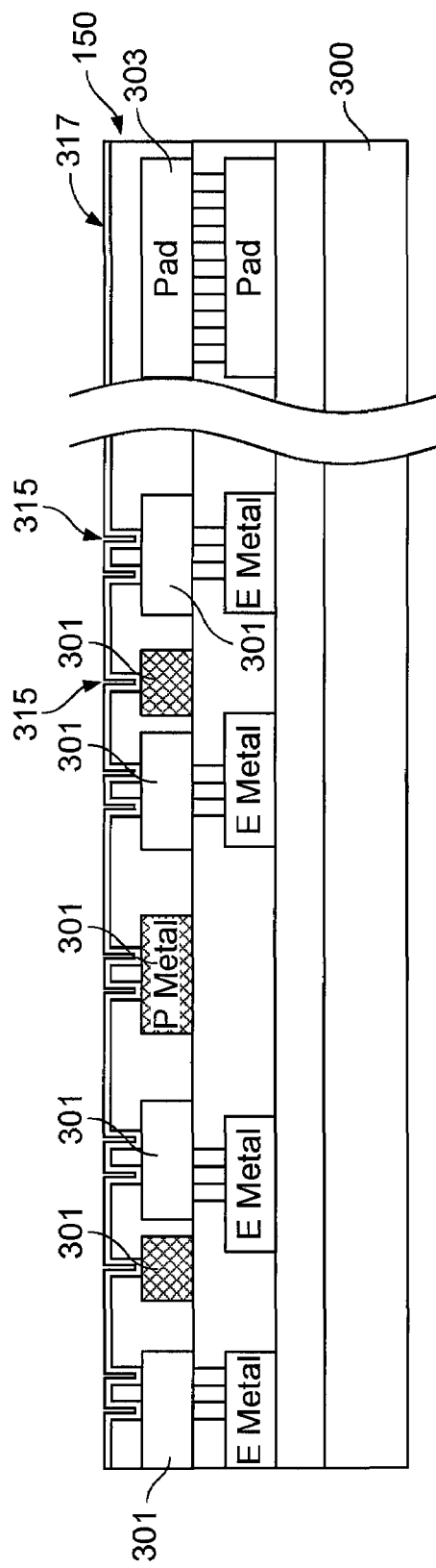
FIG. 3E is a cross-sectional view of the CMOS substrate after the TiN liner deposition.
Figure 3F:
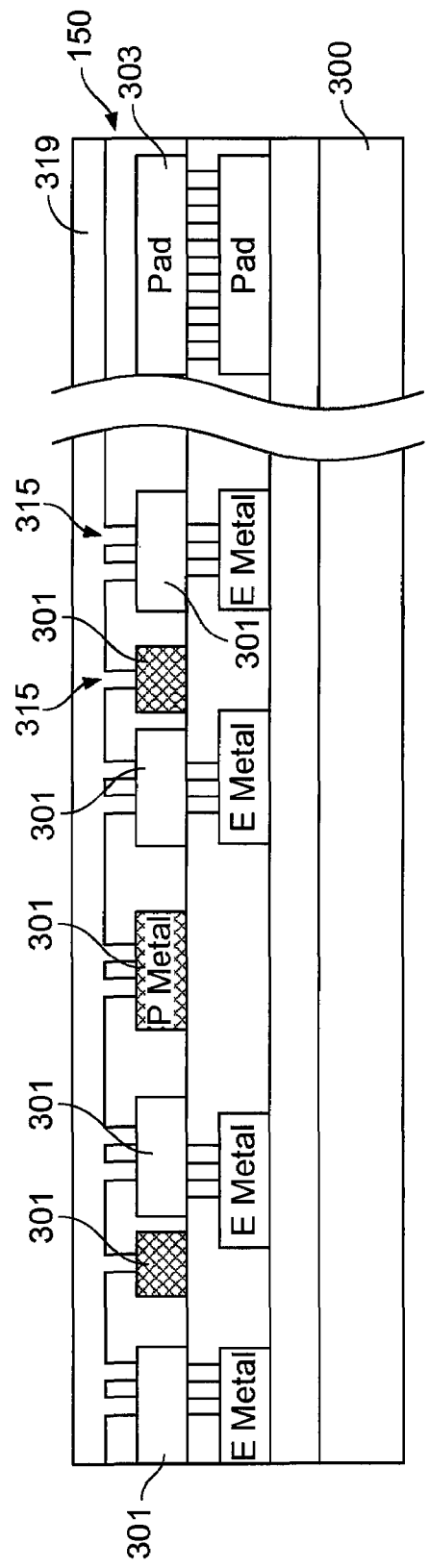
FIG. 3F is a cross-sectional view of the substrate after a metal deposition.
Figure 3G:
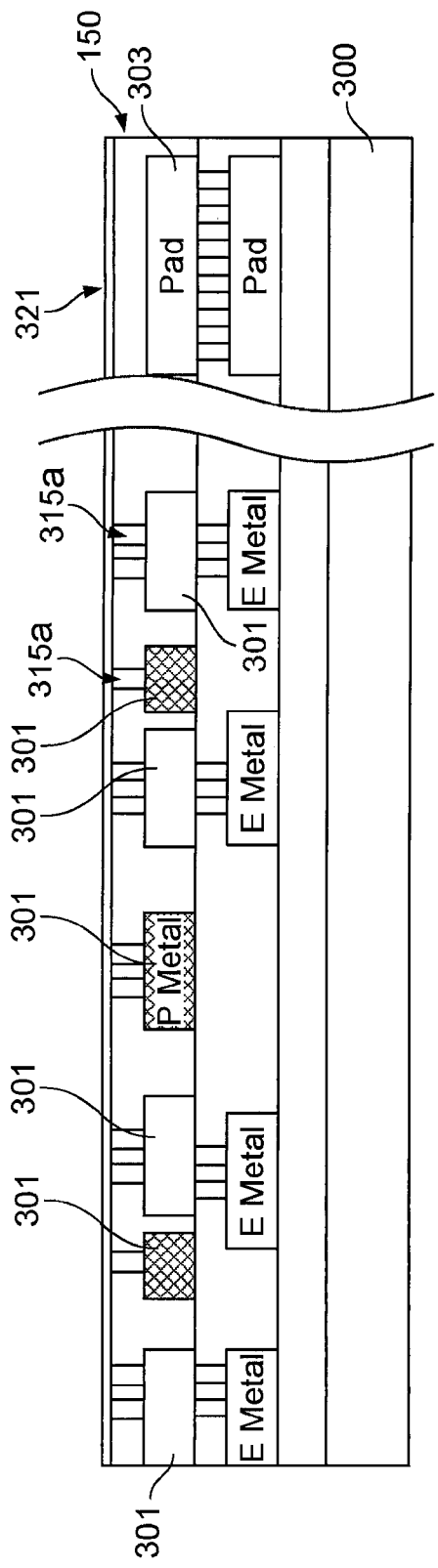
FIG. 3G is a cross-sectional view of the substrate after a TiN deposition over the upper surface CMOS substrate and the vias.

The vias are then filled with a metal to form the electric interconnect (step 225). A TiN liner layer 317 can then be optionally deposited over the vias 315 and the upper surface of the CMOS layer 150 using physical vapor deposition (PVD), as shown in FIG. 3E. A TiN liner layer 317 can improve the electric contact between a deposited layer and the underlying surface. The TiN liner layer 317 is then partially removed. A Tungsten layer 319 is deposited over the TiN liner layer 317 to fill the vias 315 using chemical vapor deposition (CVD), as shown in FIG. 3F (TiN layer 317 not shown). The Tungsten layer 319 is then planarized. A TiN liner layer 321 is optionally deposited using PVD over the planarized surface and the metal filled vias 315a as shown in FIG. 3G.

Figure 3H:
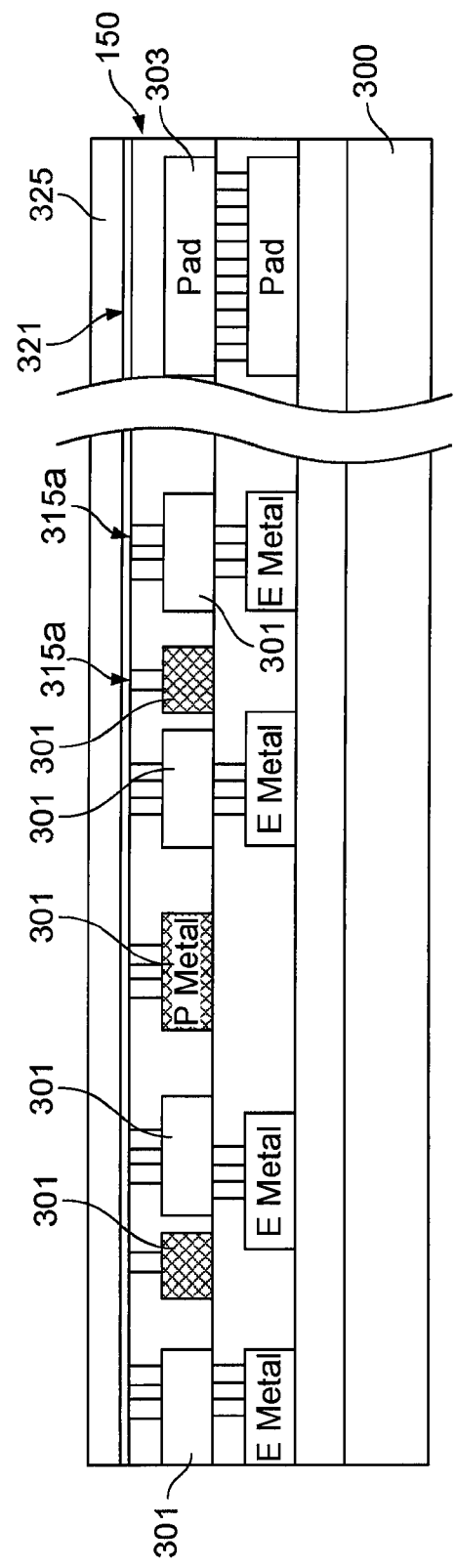
FIG. 3H is a cross-sectional view of the substrate after a first electrode layer is deposited over the TiN layer shown in FIG. 3G.

A first electrode layer 325 is next formed (step 230) by depositing amorphous silicon using plasma enhanced chemical vapor deposition (PECVD) over the TiN layer 321 as shown in FIG. 3H (for clarity reason, the TiN layer 321 is not shown in FIG. 3I and the subsequent figures). Other materials suitable for the first electrode layer 325 include polysilicon, silicon, aluminum, and aluminum-silicon alloys. A silicon oxide layer 327 is then deposited over the first electrode layer 325, as shown in FIG. 3I.

Figure 3K:
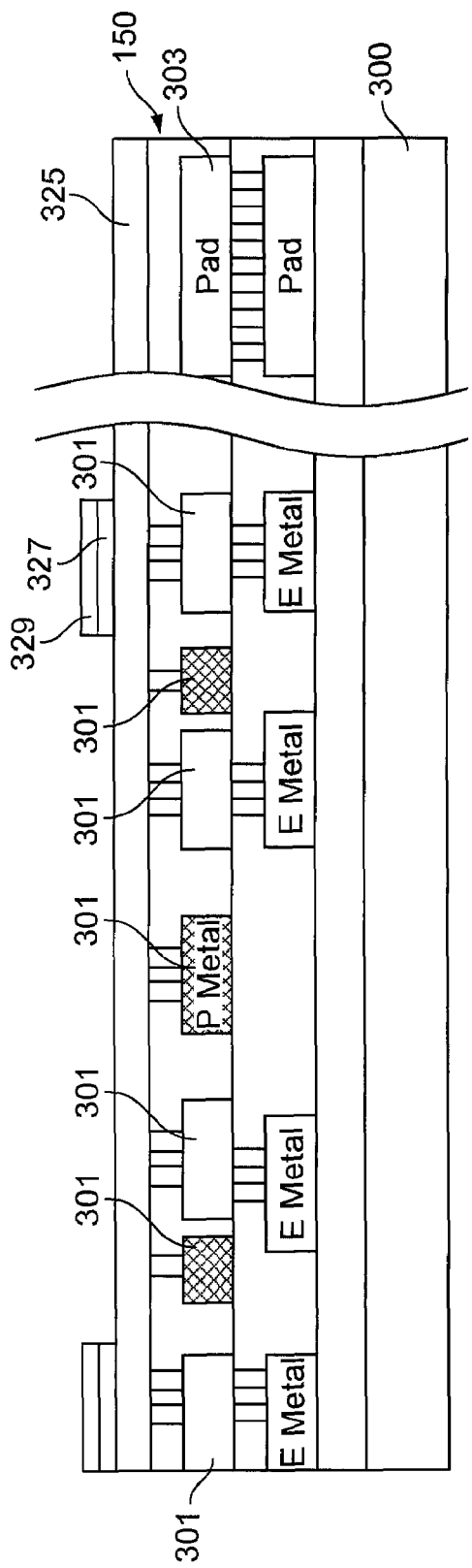
FIG. 3K is a cross-sectional view of the substrate after the etching removal of the silicon dioxide layer using the photoresist mask shown in FIG. 3J.
Figure 3L:
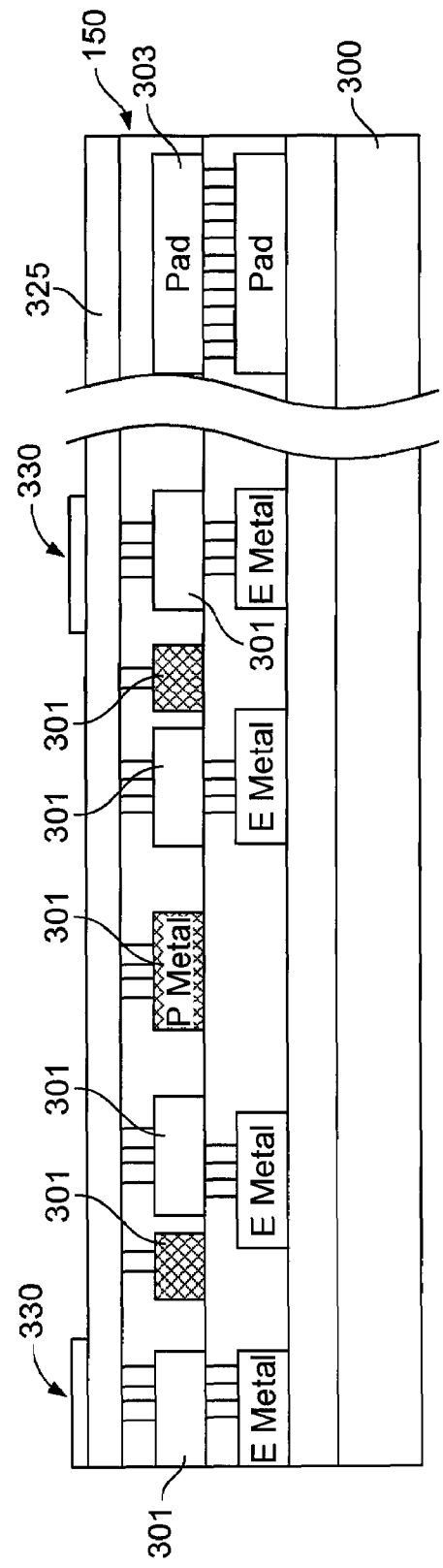
FIG. 3L is a cross-sectional view of the substrate having a first hard mask over the first electrode layer after the removal of the photoresist mask shown in FIG. 3K.

A first hard mask 330 is then formed over the first electrode layer 325 (step 235). A TiN liner layer can optionally be deposited over the first electrode layer 325 using PVD. An insulator layer, such as a silicon dioxide layer 327 is then deposited over the TiN liner layer or the first electrode layer 325, as shown in FIG. 3I. A photoresist mask 329 is next patterned over the silicon dioxide layer 327 using lithography, as shown in FIG. 3J. The silicon dioxide layer 327 is then dielectrically etched using the photoresist mask 329, as shown in FIG. 3K. The remaining photoresist is removed by microwave cleaning to form the first hard mask 330 as shown in FIG. 3L.

A second electrode layer 335 is next formed over the first electrode layer 325 and the first hard mask 330 (step 240) by depositing a layer of amorphous silicon as shown in FIG. 3M. Other materials suitable for the second electrode layer 335 include polysilicon, silicon, aluminum, and aluminum-silicon alloys. The first hard mask 330 is now embedded under the second electrode layer 335.

A second hard mask 340 is then formed over the second electrode layer 335 (step 245), as shown in FIG. 3N, using similar processing steps as those for the formation of the first hard mask 330 in step 235.

A third electrode layer 345 is next formed over the second electrode layer 335 and the second hard mask 340 (step 250) by depositing a layer of amorphous silicon as shown in FIG. 3O. Materials suitable for the third electrode layer 345 include polysilicon, silicon, aluminum, and aluminum-silicon alloys. The second hard mask 340 is now embedded under the second electrode layer 345.

A third hard mask 350 is then formed over the third electrode layer 345 (step 255), as shown in FIG. 3P, using similar processing steps as those for the formation of the first hard mask 330 in step 235. The third electrode layer 345, the second electrode layer 335, and the first electrode layer 325 can be registered by aligning their respective photoresist masks to one or more registration marks on the CMOS substrate 150.

A microstructure is formed (step 260) by a multi-layer anisotropic silicon etching of the third electrode layer 345, the second electrode layer 335, and the first electrode layer 325 as shown in FIG. 3Q. The amorphous silicon materials not covered by the third hard mask 350, the second hard mask 340, and the first hard mask 330 are removed from the third electrode layer 345, the second electrode layer 335, and the first electrode layer 325. For example, the amorphous silicon materials in all three electrode layers 325, 335, and 345 under the third hard mask 350 are not removed in the silicon etching to form the hinge support post 360. The amorphous silicon materials in the second and the first electrode layers 325 and 335 under the second hard masks 340 are not removed to form the step substrate electrodes 361 and the landing tips 363. The amorphous silicon materials in the first electrode layer 325 under the first hard mask 330 are not removed in the silicon etching to form the electrodes 362. As a result, a hinge support post 360, step substrate electrodes 361, landing tips 363, and electrodes 362 having various heights can be formed over the CMOS substrate 150 in an etching step. The heights of the hinge support post 360, the step substrate electrodes 361, the landing tips 363, and the electrodes 362 are respectively determined by the cumulative layer thickness under their associated hard masks 330, 340, and 350.

As shown in FIG. 3Q, the micro structures 359 including the hinge support post 360, the step substrate electrodes 361, the landing tips 363, and the electrodes 362 include structure portions having three different heights. The height of the hinge support post 360 is defined by the total thickness of the first electrode layer 325, the second electrode layer 335, and the third electrode layer 345. The heights of the step substrate electrodes 361 and the landing tips 363 are determined by the thickness of the first electrode layer 325 and the second electrode layer 335. The height of the electrodes 362 is defined by the thickness of the first electrode layer 325.

The hinge support post 360, the step substrate electrodes 361, the landing tips 363, and the electrodes 362 include structures are each connected with the CMOS substrate 150 and laterally separated over the CMOS substrate 150. Furthermore, the hinge support post 360, the step substrate electrodes 361, the landing tips 363, and the electrodes 362 include electrically conductive materials that are connected respectively with their associative metallic pads 301 for receiving voltage signals for the driving the mirror plate. The hinge layer 375 (as shown in FIG. 3X) is electrically connected with the hinge support post 360. The landing tips 363 are set at the same electric potential as the hinge layer 375. The electric potential difference between the electrodes 361, 362 and the hinge layer 375 can generate the necessary electrostatic force to tilt the mirror plate.

Figure 3S:
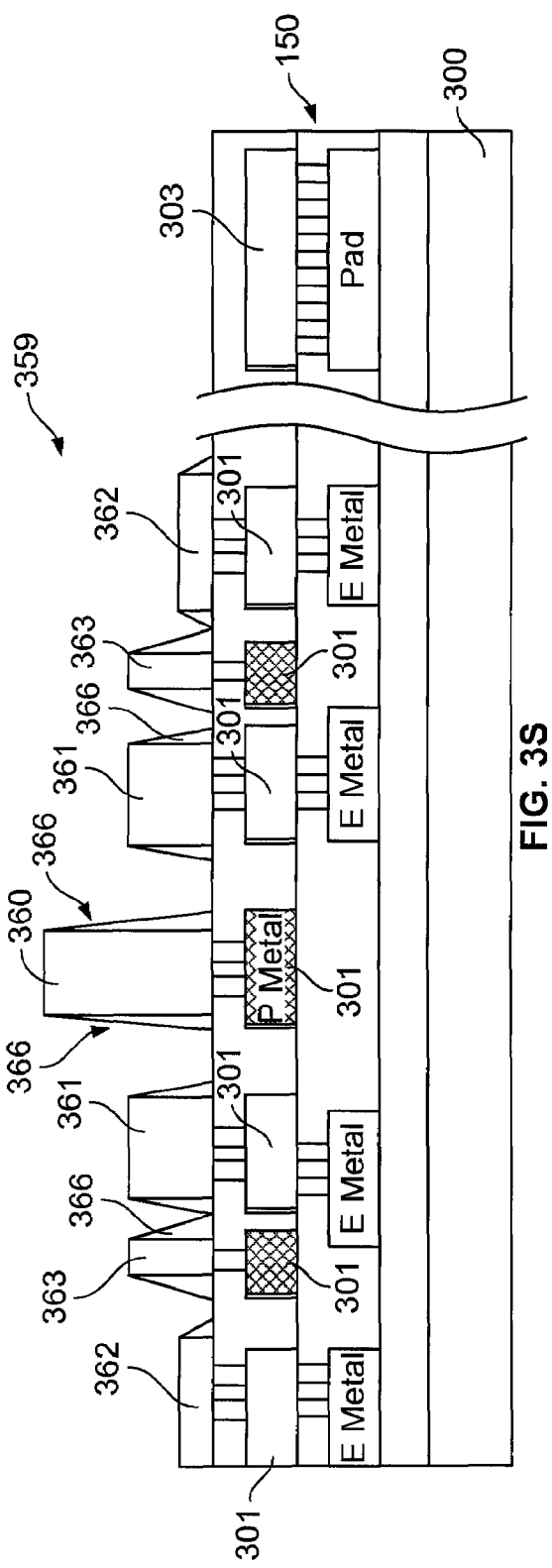
FIG. 3S illustrates the final form of the spacer over the micro structure of FIG. 3Q.

A spacer material 365 is next deposited over the micro structures 359 comprising the hinge support post 360, the step substrate electrodes 361, the landing tips 363, and the electrodes 362, as shown in FIG. 3R (step 265). The spacer material 365 can include a dielectric material, such as silicon dioxide. The spacer material 365 is subsequently etched, such as by dielectric etching, to form spacer 366, as shown in FIG. 3S. The first, second, and third hard masks 330,340,350 are also removed in the etching process. The spacer 366 is used to reduce the sacrificial material used in the following steps as described below and to enhance the strengths of the micro structures 359 over the CMOS substrate.

Figure 3T:
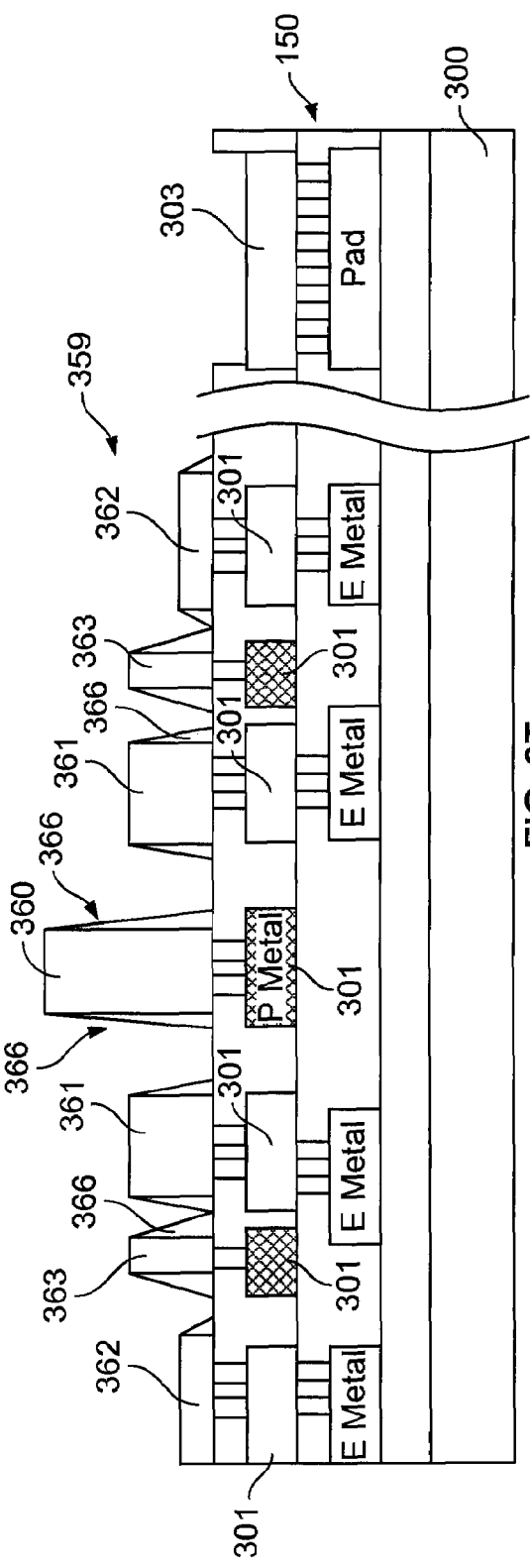
FIG. 3T illustrates a cross-sectional view of the substrate after the etching to expose the pad electrode.

The silicon in the CMOS substrate 150 is next etched to expose the pad electrode 303 for the SLM 100, as shown in FIG. 3T (step 265). The etching can include coating and patterning of a photoresist material. The material in the CMOS substrate 150 over the pad electrode 303 is subsequently removed by etching. The pad electrode 303 allows external electric signals to be input to the addressing and driving circuit 151 in the CMOS substrate 150 to address and control the movement of the micro mirrors in the SLM 100.

Figure 3U:
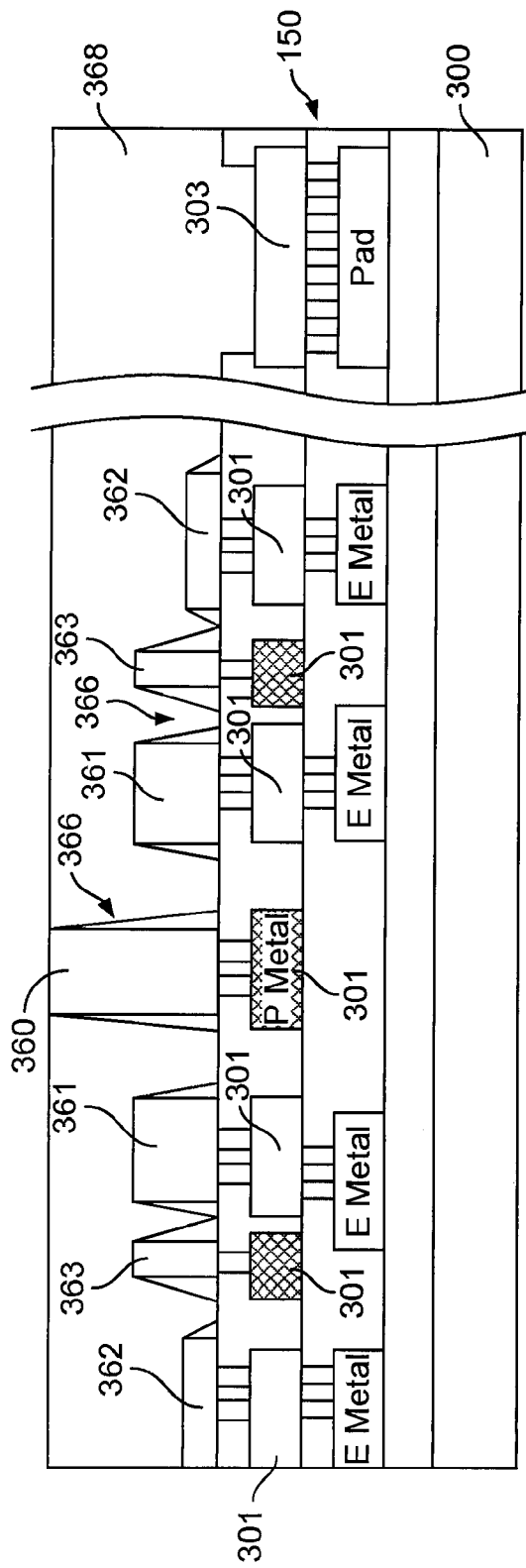
FIG. 3U illustrates a cross-sectional view of the substrate after the deposition of sacrificial material and the planarization of the sacrificial material.

A sacrificial material 368 such as a photoresist is next spin-coated over the micro structures 359. The sacrificial material 368 is hardened and then etched back as shown in FIG. 3U. The upper surface of the sacrificial material 368 is planarized to the same height as the upper surface of the hinge support post 360. The sacrificial material 368 is used for fabricating the mirror plate as described below.

Figure 3V:
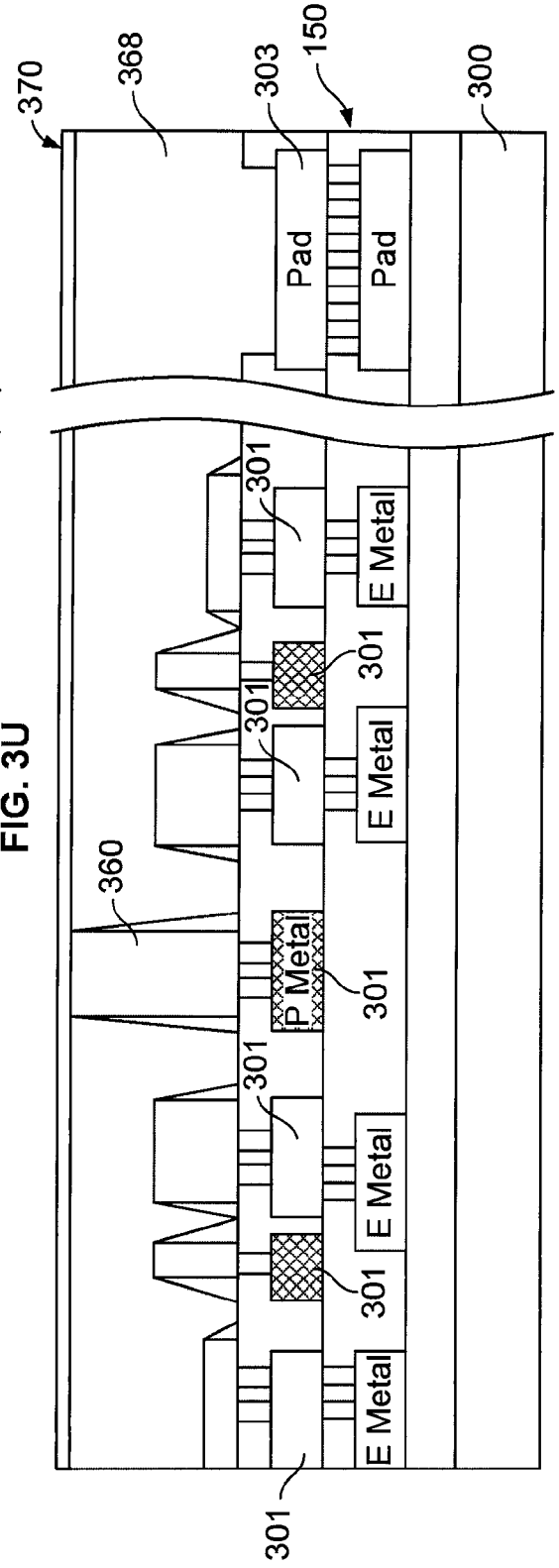
FIG. 3V is a cross-sectional view of the substrate after the deposition of a TiN layer over the planarized sacrificial material.

A TiN layer 370 is next deposited over the sacrificial material 368 and the hinge support post 361 as shown in FIG. 3V (step 270). The TiN layer 370 is then patterned by a photoresist mask and etched to form one or more holes 371 that are through the TiN layer 370 and extend into the top portion of the hinge support post 360, as shown in FIG. 3W. The remaining photoresist is removed by microwave cleaning. A hinge layer 375 is next deposited by PVD to fill the holes 371 and over the TiN layer 370. The hinge layer 375 can include Titanium. Anchors 372 are formed to anchor the hinge layer 375 into the top portion of the hinge support post 360, as shown in FIG. 3X.

Figure 3Y:
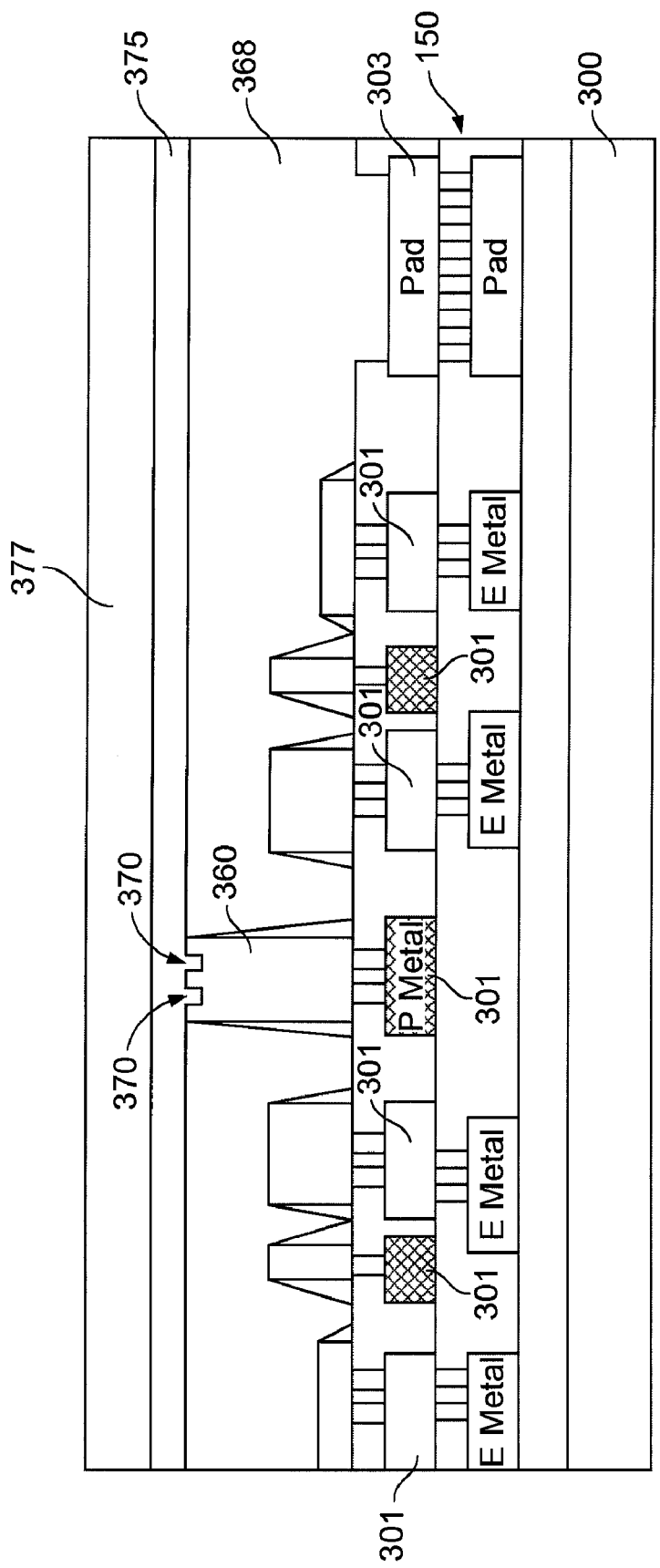
FIG. 3Y is a cross-sectional view of the substrate after the deposition of a spacer layer for the mirror platen over the Ti layer shown in FIG. 3X.

An amorphous silicon layer 377 is next sputter deposited over the hinge layer 375 using PVD as shown in FIG. 3Y (step 275). The amorphous silicon layer 377 will serve as a spacer layer (113) for the mirror plate.

Figure 3Z:
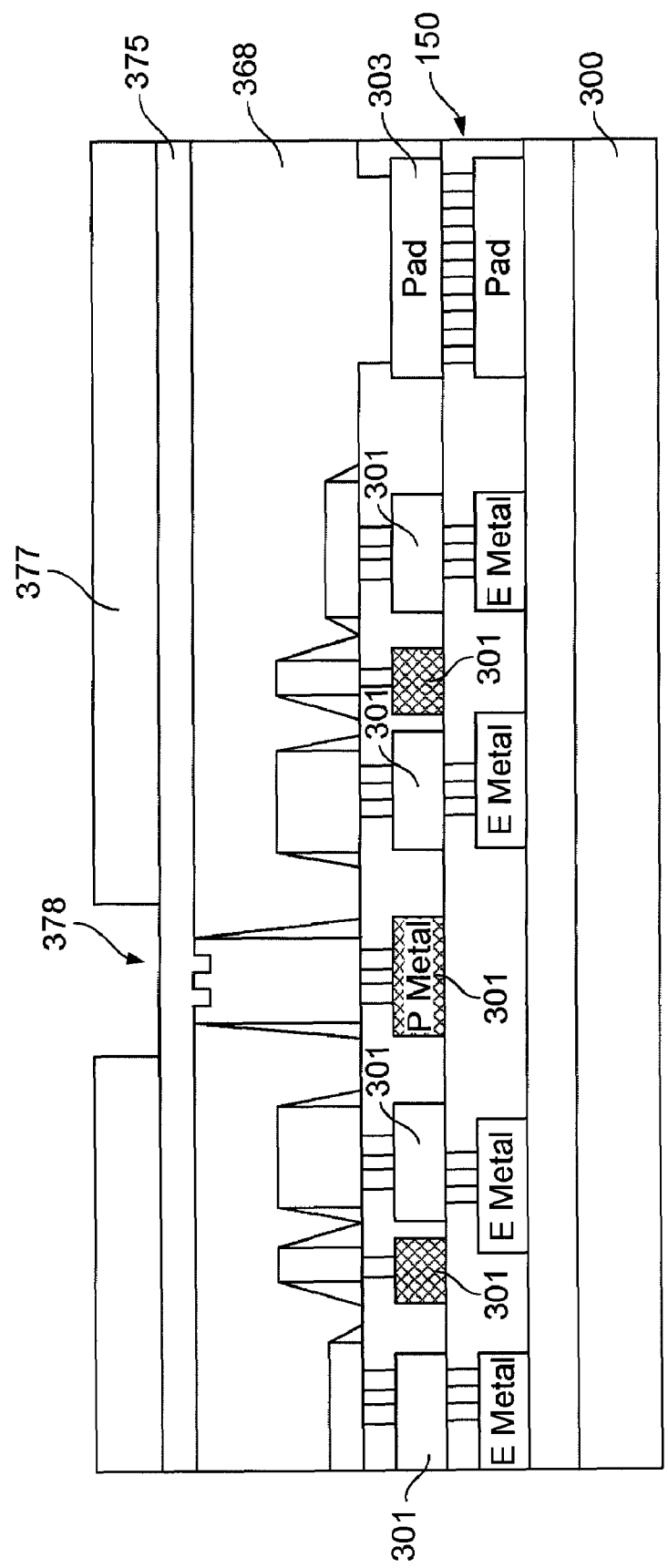
FIG. 3Z is a cross-sectional view of the substrate after the etching formation of the cavity for the hinge component.
Figure 4A:
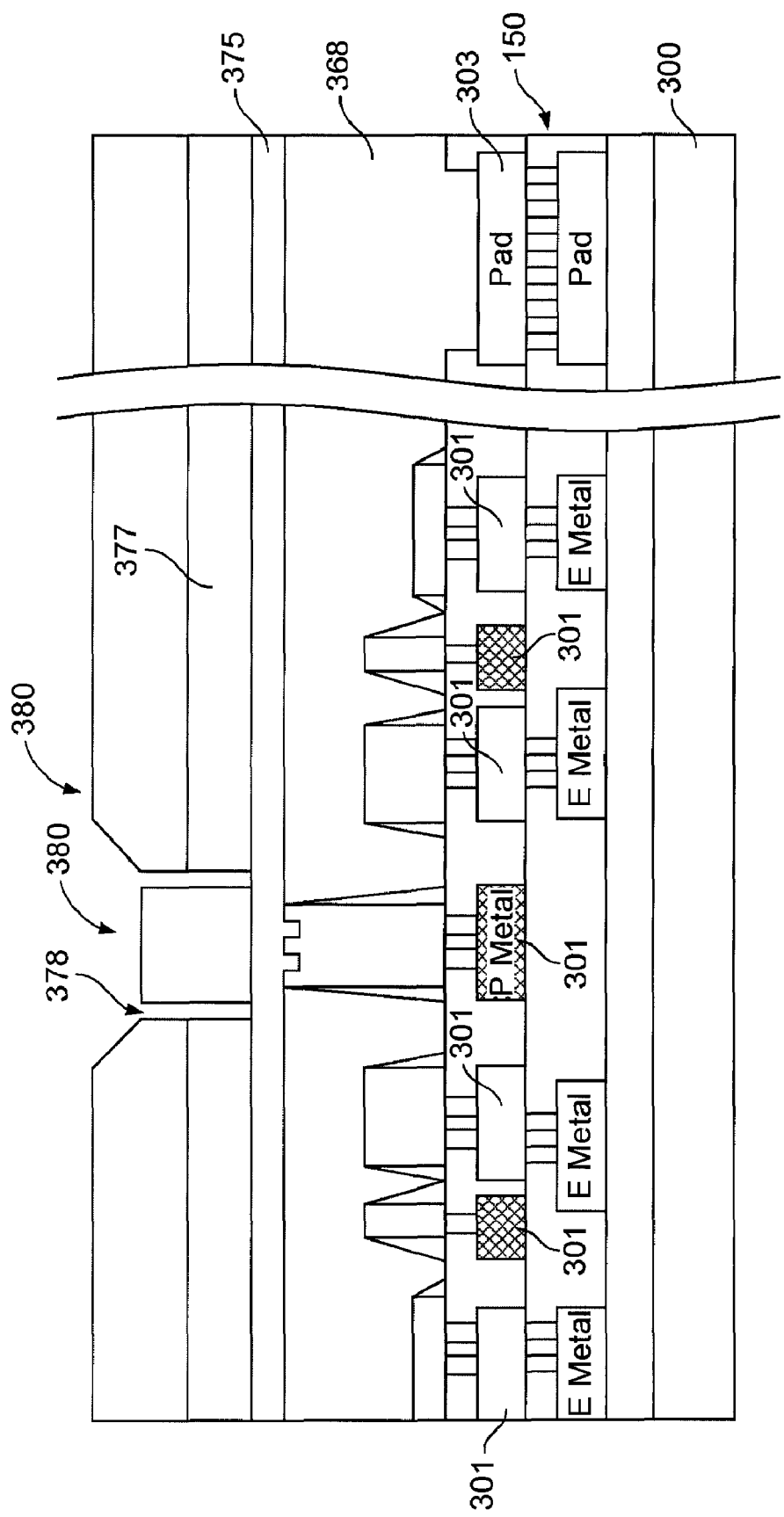
FIG. 4A illustrates a hinge mask formed over cavity and the spacer layer of the mirror plate shown in FIG. 3Z.
Figure 4B:
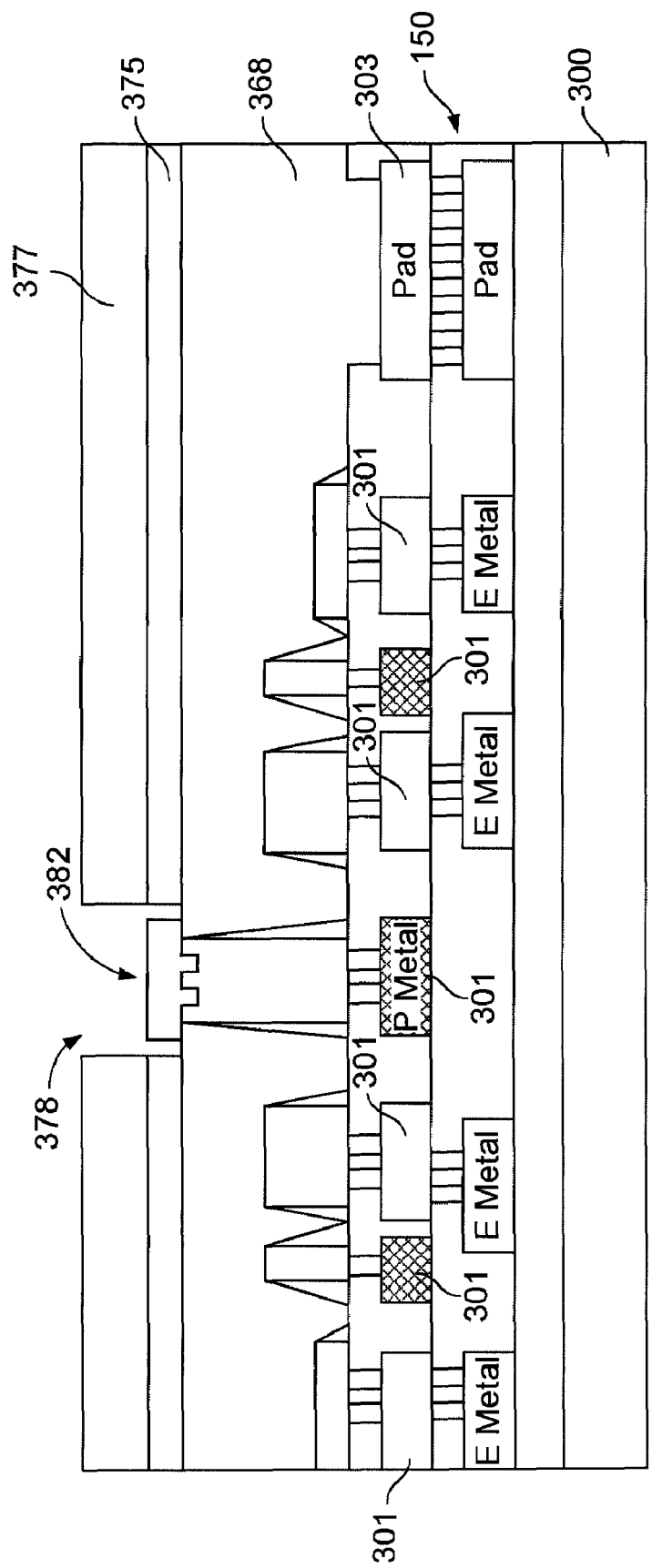
FIG. 4B illustrates the formation of the hinge component anchored into the hinge support post after the removal of the etching and the removal of the photoresist.
Figure 4C:
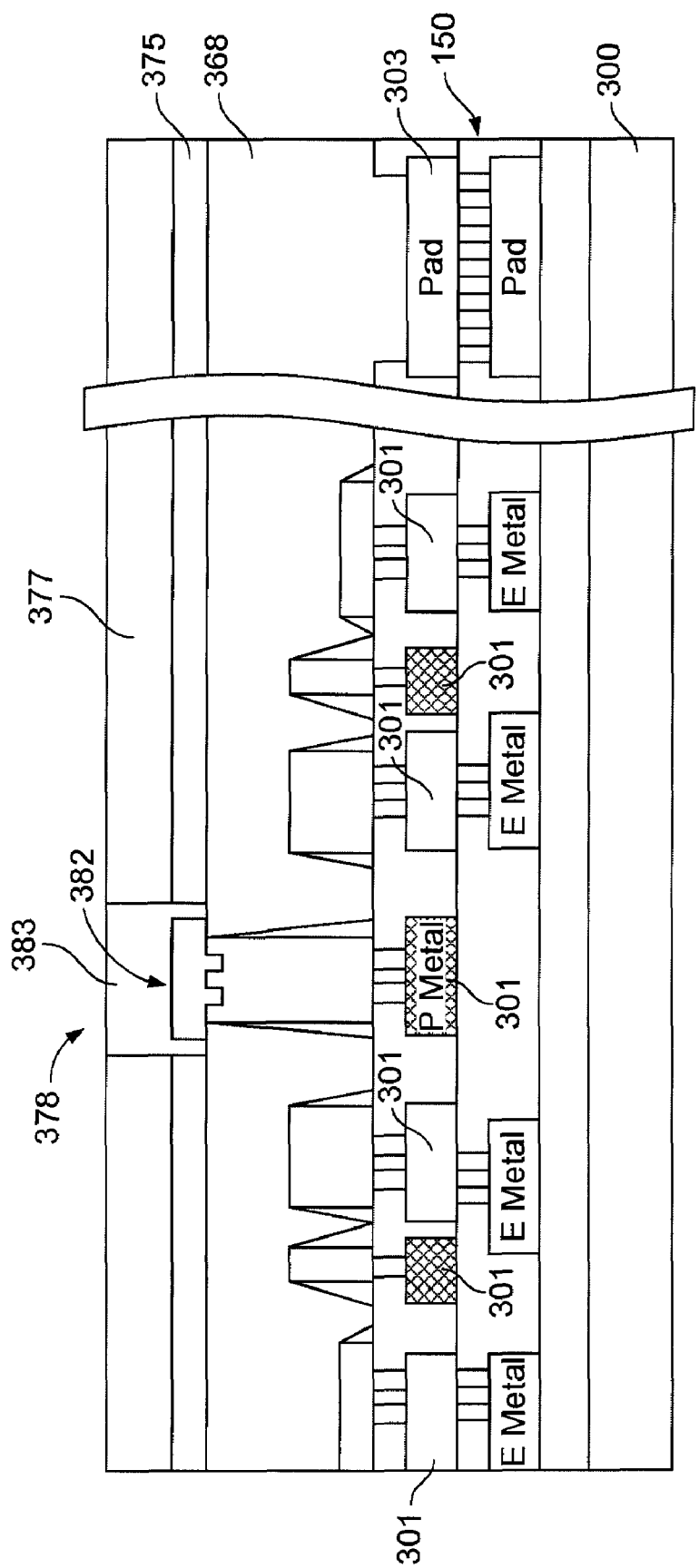
FIG. 4C illustrates the deposition of the sacrificial photoresist material to fill the gap between the hinge component and the mirror plate.

The hinge component is next formed (step 280). The amorphous silicon layer 377 is first etched to form a recess 378 above the hinge support post 360 using a photoresist mask, as shown FIG. 3Z. A hinge mask 380 including a photoresist material is then coated over the amorphous silicon layer 377 and the recess 378. The coated photoresist material would follow the height profile of the amorphous silicon layer 377 at the recess 378. The coated photoresist material is then patterned in the recess 378, which results in a pattern as shown in FIG. 4A. The hinge layer 375 is then etched to separate the side surfaces of the hinge component 382, as shown in FIG. 4B. The hinge component 382 is anchored to the top portion of the hinge support post 360. The photoresist material is subsequently removed by microwave cleaning. A sacrificial material 383 is then spin-coated and etched back to fill the recess 378 to the same level as the upper surface of the amorphous silicon layer 377, as shown in FIG. 4C. The sacrificial material 383 is connected with the sacrificial material 368 to be used to assist the formation of the mirror plate.

Figure 4D:
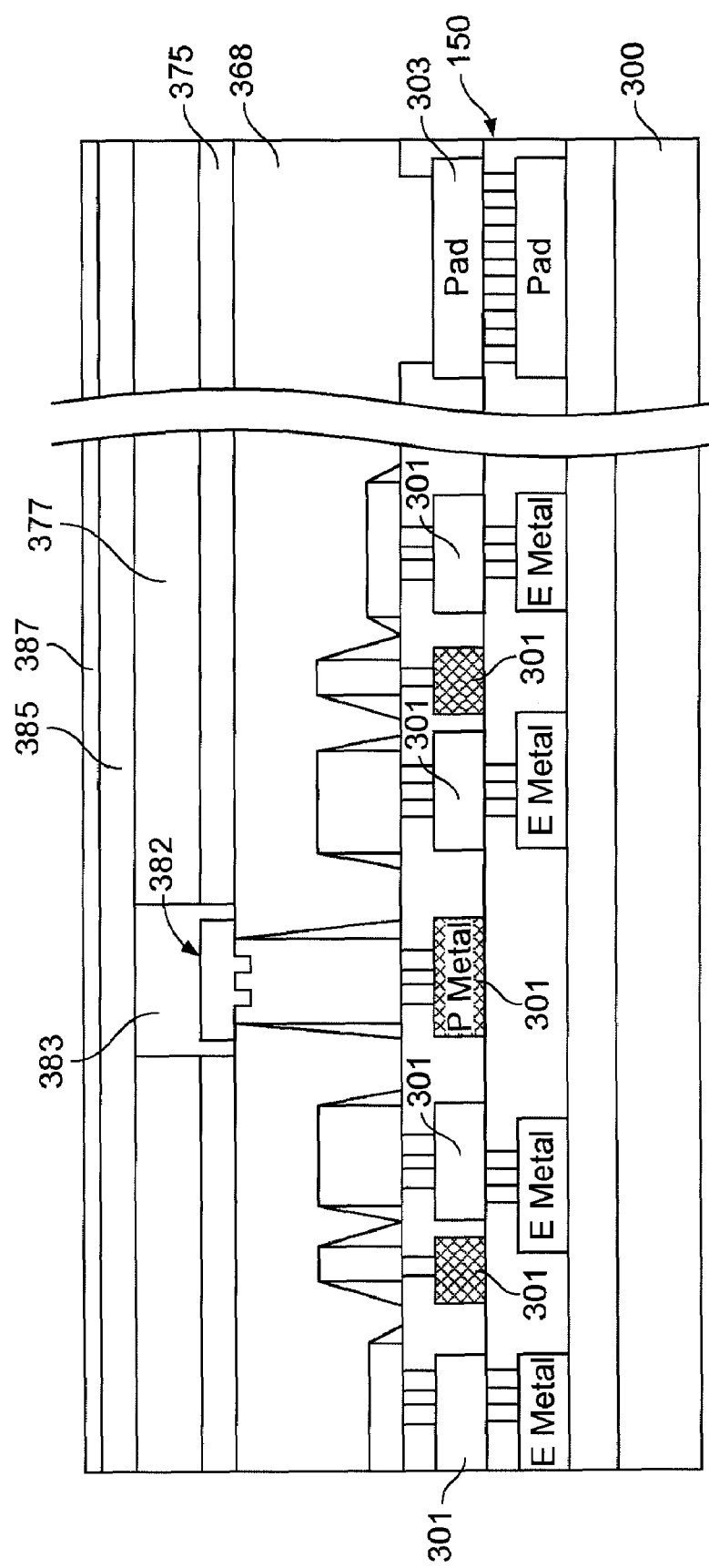
FIG. 4D illustrates the substrate after the depositions of an amorphous silicon layer and an aluminum layer over the structure shown in FIG. 4C.

A reflective layer 387 and a support layer 385 for the mirror plate are next formed (step 285). As shown in FIG. 4D, a support layer 385 is deposited over the amorphous silicon layer 377 and the sacrificial material 383. The support layer 385 can be made of amorphous silicon. Aluminum is subsequently deposited over the support layer 385 to form the reflective layer 387 for deflecting incident light off the mirror plate 400. Other suitable metals for the include Au, and Au/Al alloys. The reflective layer 387 can be 400 angstroms or less in thickness.

Figure 4E:
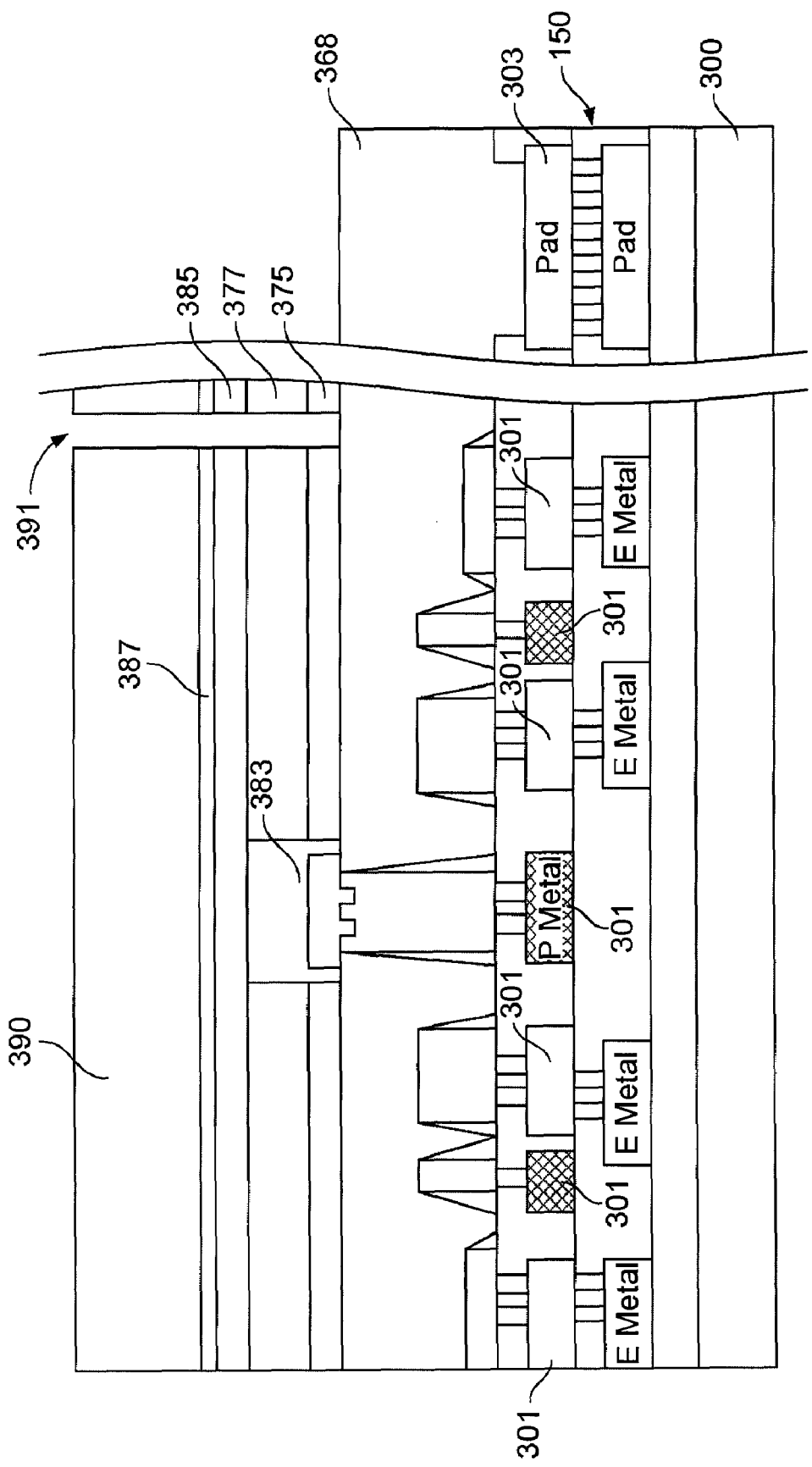
FIG. 4E illustrates the separation of the adjacent mirror plates after the etching of a stack of layers for the mirror plate.

The stack of mirror layers is next etched to separate adjacent mirror plates (step 290). A photoresist layer 390 is first coated and then patterned over the aluminum layer 387. The stack of the reflective layer 387, the support layer 385, the amorphous silicon layer 377, and the hinge layer 375 are etched through to form gaps 391 to separate the adjacent mirror plates on the spatial light modulator 100, as shown in FIG. 4E.

Figure 4F:
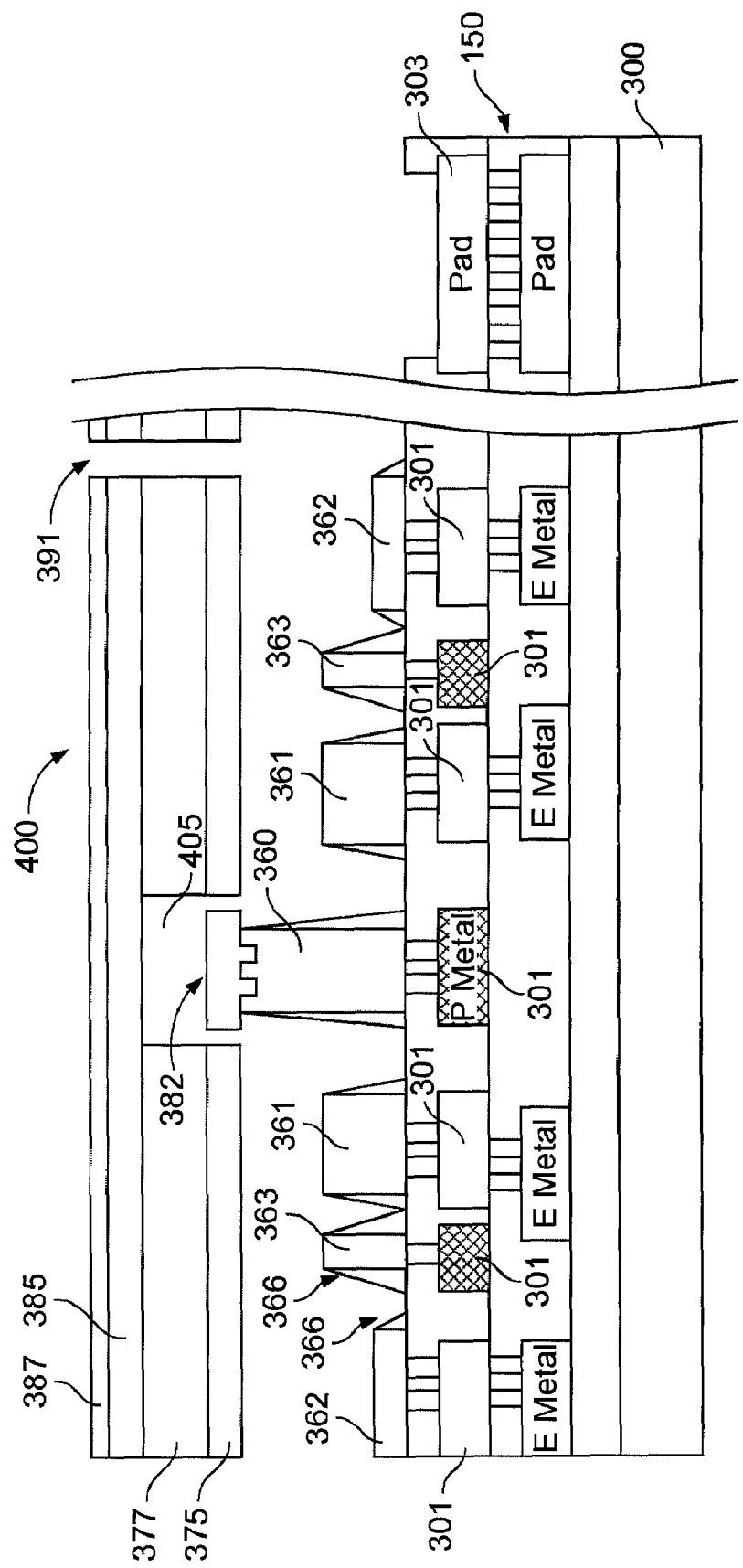
FIG. 4F illustrates the formation of separate tiltable mirror plates having hidden-hinges after the removal of sacrificial material.

The sacrificial materials are removed using plasma cleaning to finally form separate mirror plates 400 as shown in FIG. 4F (step 295). The mirror plate 400 includes a plurality of layers: the reflective layer 387, the support layer 385, the amorphous silicon layer 377, and the hinge layer 375. The mirror plate 400 also includes a cavity 405 that is formed by the removal of the sacrificial material 383. The hinge component 382 extends into a cavity 405 and is completely hidden under the mirror plate 400. The mirror plate 400 is connected to the hinge component 382 to serve as a pivot point for the tilt movement of the mirror plate 400.

One or more hinge support posts 360, the step electrodes 361, the landing tips 363, and the electrodes 362 are formed over the CMOS substrate 150 under each mirror plate 400. Typical dimensions of the SLM 100 are as follows. The hinge component 382 can be 4.5 µm long, 0.4 µm wide, and 0.06 µm thick (see FIG. 1A). The hinge support post 360 can be 0.8 µm wide and 1.35 µm high. The landing tips can be 1.0 µm high and 0.4 µm wide. The electrodes 362 can be 0.35 µm high. The top faces of the step substrate electrodes 361 can be 0.7 µm in height.

It is understood that the disclosed methods are compatible with other configurations of micro structures having a plurality of structure portions having different heights over a substrate. For example, a micro structure can include two structure portions having different heights. The micro structure can be fabricated by depositing a first layer over a substrate, patterning a first hard mask over the first layer, depositing a second layer over the first layer and the first hard mask, and patterning a second hard mask over the second layer. The micro structure is formed by selectively removing the materials in the first and second layers not covered by either of the first mask and the second mask in an etching step. The material removal step can be implemented by anisotropic etching through the first and the second layers. The etching can be implemented in a single step or a plurality of steps. The structure portions having different heights can be separated or connected laterally over the substrate.

The micro structures compatible with the disclosed method can include for example MEMS for display and printing, micro actuators, micro controllers, micro fluidic systems, and micro sensors.

It is understood that although the present specification discloses an example of etching a plurality of structural components in a single etching step, the disclose methods and system do not exclude processes using more etching steps. For example, a portion of the structure can be formed by etching two layers of deposited materials using embedded hard masks. Another portion of the structure can be subsequently formed by etching the material in a third layer using a hard mask over the third layer. Furthermore, the process and materials of forming hard masks and the layers that define the height of the micro structures can include many options without deviating from the spirit of the present specification. The present invention is compatible with a wide range of micro mechanical devices such as actuators or passive devices.

What is claimed is:

1. A method for fabricating a micro mirror over a substrate, the method comprising:
   depositing a first layer of a first material over the substrate;
   patterning a first hard mask over the first layer;
   depositing a second layer of a second material over the first layer and the first hard mask;
   patterning a second hard mask over the second layer;
   selectively removing the first material and the second material not covered by any of the first hard mask and the second hard mask to produce a hinge support post having a first height and an electrode having a second height over the substrate; and
   forming a mirror plate comprising a reflective upper surface and a hinge component in connection with the hinge support post, wherein the mirror plate is configured to tilt around the hinge component.

2. The method of claim 1, wherein the first height is higher than the second height.

3. The method of claim 1, wherein the mirror plate comprises a conductive lower surface, and wherein the mirror plate is configured to tilt around the hinge component when an electric voltage is applied between the electrode over the substrate and the conductive lower surface of the mirror plate.

4. The method of claim 1, further comprising selectively removing the first material and the second material not covered by any of the first hard mask and the second hard mask to produce a landing tip having a second height over the substrate, wherein the landing tip is configured to stop the tilt movement of the mirror plate about the hinge component.

5. The method of claim 1, wherein the first material or the second material is selected from the group of amorphous silicon, polysilicon, silicon, aluminum, and aluminum-silicon alloys.

6. The method of claim 2, wherein the hinge support post and the electrode are laterally separated over the substrate.

7. The method of claim 1, wherein the first structure portion or the second structure portion comprises a substantially flat upper surface and substantially vertical side surfaces.

8. The method of claim 1, wherein the first material or the second material comprises an electrically conductive material.

9. The method of claim 1, wherein the first hard mask or the second hard mask includes silicon dioxide or TiN.

10. The method of claim 2, wherein the first hard mask is embedded between the first layer and the second layer.

11. The method of claim 1, further comprising:
    controlling the first height of the electrode by controlling a thickness of the first layer.

12. The method of claim 1, further comprising:
    controlling the second height of the hinge support post by controlling a thickness of the first layer and a thickness of the second layer.

13. The method of claim 1, further comprising anisotropically etching to selectively remove the second material in the second layer not covered by the second hard mask and the first material in the first layer not covered by the first hard mask or the second hard mask.

14. The method of claim 1, further comprising
    selectively removing the second material in the second layer not covered by the second hard mask and the first material in the first layer not covered by the first hard mask or the second hard mask in a single etching step.

15. A method for fabricating a micro mirror over a substrate, the method comprising:
    depositing a first layer of a first material over the substrate;
    patterning a first hard mask over the first layer;
    depositing a second layer of a second material over the first layer and the first hard mask;
    patterning a second hard mask over the second layer;
    selectively removing the first material and the second material not covered by any of the first hard mask and the second hard mask to produce a hinge support post having a first height, an electrode having a second height, and a landing tip having a second height over the substrate; and
    forming a mirror plate comprising a reflective upper surface and a hinge component in connection with the hinge support post, wherein the mirror plate is configured to tilt around the hinge component.

16. The method of claim 15, wherein the first height is higher than the second height.

17. The method of claim 15, wherein the landing tip is configured to stop the tilt movement of the mirror plate about the hinge component.

18. The method of claim 15, wherein the mirror plate comprises a conductive lower surface, and wherein the mirror plate is configured to tilt around the hinge component when an electric voltage is applied between the electrode over the substrate and the conductive lower surface of the mirror plate.

19. A method for fabricating a micro mirror over a substrate, the method comprising:
    depositing a first layer of a first material over the substrate;
    patterning a first hard mask over the first layer;
    depositing a second layer of a second material over the first layer and the first hard mask;
    patterning a second hard mask over the second layer;
    depositing a third layer of a third material over the second layer and the second hard mask;
    patterning a third hard mask over the third layer;
    selectively removing the first material, the second material, and the third material not covered by any of the first hard mask, the second hard mask, and the third hard mask to produce over the substrate a hinge support post having a first height, a first electrode having a second height, and a landing tip having a second height, and a second electrode having a third height; and
    forming a mirror plate comprising a reflective upper surface and a hinge component in connection with the hinge support post, wherein the mirror plate is configured to tilt around the hinge component.

20. The method of claim 15, wherein the first height is higher than the second height.

21. The method of claim 15, wherein the second height is higher than the third height.

22. The method of claim 15, wherein the landing tip is configured to stop the tilt movement of the mirror plate about the hinge component.

23. The method of claim 15, wherein the first electrode and the second electrode are electrically connected.

24. The method of claim 15, wherein the mirror plate comprises a conductive lower surface, and wherein the mirror plate is configured to tilt around the hinge component when an electric voltage is applied between the conductive lower surface of the mirror plate and the first electrode or the second electrode over the substrate.

* * * * *